(12) United States Patent
Ryu et al.

(10) Patent No.: US 11,049,901 B2
(45) Date of Patent: Jun. 29, 2021

(54) DISPLAY APPARATUS INCLUDING LIGHT-RECEIVING DEVICE

(71) Applicant: LG Display Co., Ltd., Seoul (KR)

(72) Inventors: Sungpil Ryu, Paju-si (KR);
Hyung-Seok Bang, Paju-si (KR);
Eunju Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 12 days.

(21) Appl. No.: 16/586,447

(22) Filed: Sep. 27, 2019

(65) Prior Publication Data
US 2020/0105828 A1   Apr. 2, 2020

(30) Foreign Application Priority Data

Sep. 28, 2018   (KR) .................. 10-2018-0115675
Oct. 25, 2018   (KR) .................. 10-2018-0128472

(51) Int. Cl.
| | | |
|---|---|---|
| *H01L 27/15* | (2006.01) | |
| *G06K 9/00* | (2006.01) | |
| *H01L 31/167* | (2006.01) | |
| *G06F 3/042* | (2006.01) | |
| *H01L 27/32* | (2006.01) | |

(52) U.S. Cl.
CPC ............ *H01L 27/156* (2013.01); *G06F 3/042* (2013.01); *G06K 9/0004* (2013.01); *H01L 31/167* (2013.01); *H01L 27/323* (2013.01)

(58) Field of Classification Search
CPC ... H01L 27/156; H01L 31/167; H01L 27/323; H01L 27/3272; H01L 27/3227; H01L 31/02164; H01L 27/32; H01L 27/3244; G06K 9/0004; G06K 9/00013; G06F 3/042; G06F 3/0421; G06F 3/0412
See application file for complete search history.

(56) References Cited

U.S. PATENT DOCUMENTS 8,283,851 B2 *  10/2012  Kim ................... G06F 3/0421
                                             313/504
9,583,548 B2 *   2/2017  Park ..................... H01L 27/322

FOREIGN PATENT DOCUMENTS

| KR | 10-2018-0000158 A | 1/2018 |
| KR | 10-2018-0046788 A | 5/2018 |

* cited by examiner

*Primary Examiner* — Stephen W Smoot
*Assistant Examiner* — Vicki B. Booker
(74) *Attorney, Agent, or Firm* — Polsinelli PC

(57) ABSTRACT

A display apparatus comprises a thin-film transistor array disposed on a substrate; a plurality of electro-luminescence devices disposed on the thin-film transistor array; a plurality of light-receiving devices disposed on the thin-film transistor array and spaced apart from the plurality of electro-luminescence devices; a plurality of light shield patterns shielding the plurality of light-receiving devices; and at least one opening pattern arranged in each light shield pattern that has a predetermined opening direction.

27 Claims, 24 Drawing Sheets

DISPLAY APPARATUS INCLUDING LIGHT-RECEIVING DEVICE

CROSS REFERENCE TO RELATED APPLICATION

The present disclosure claims priority to and the benefit of Korean Patent Application No. 10-2018-0115675 filed on Sep. 28, 2018, and Korean Patent Application No. 10-2018-0128472 filed on Oct. 25, 2018, which are hereby incorporated by reference in their entireties.

BACKGROUND

Field of the Disclosure

The present disclosure relates to a display apparatus, and more particularly, to a display apparatus including a light receiving device. Although the present disclosure is suitable for a wide scope of applications, it is particularly suitable for enhancing a signal-to-noise ratio of a display apparatus including a light-receiving device for sensing a touch and/or a fingerprint.

Description of the Background

A display apparatus has been applied to a variety of electronic devices such as a TV set, a mobile phone, a laptop, a tablet and the like. Accordingly, research into a thin display apparatus, a lightweight display apparatus, a display apparatus that consumes less electricity and the like has been underway.

The display apparatus can be classified into a liquid crystal display (LCD) apparatus, a plasma display panel (PDP) apparatus, a field emission display (FED) apparatus, an electro-wetting display (EWD) apparatus, an electro-luminescence display device (ELDD) and the like.

In general, the display apparatus includes display panels (hereinafter referred to as "display panel" or "panel") that emit light for displaying images. The display panels may include a pair of substrates that face each other, and a light-emitting material or a liquid crystal material that is disposed between the pair of substrates.

The display apparatus may further include a sensor for sensing a touch such that user convenience is enhanced and that the display apparatus can be applied to a wider range of products. By doing so, the sensor may sense a location of a touch that is input onto a display surface, and input may be performed. Accordingly, the display apparatus including touching sensing may be substituted for an additional input device such as a mouse, a keyboard and the like. Further, types of comprising sensors for sensing a touch may involve an add-on type, an on-cell type, an in-cell type and the like. In the add-on type, a touch sensing panel that includes sensors for sensing a touch arranged in a matrix form is additionally prepared, and the additional touch sensing panel is disposed either above or below a display panel. In the on-cell type, sensors for sensing a touch are disposed above a light-emitting material or a liquid crystal material between a pair of substrates of a display panel. In the in-cell type, a plurality of display pixel areas, a thin-film transistor array for driving a plurality of display pixel areas and sensors for sensing a touch are integrated above a substrate. Unlike the add-on type and the on-cell type panels, the in-cell type panel may have a minimized thickness.

Methods for sensing a touch may include a method for sensing a location at which resistance is varied (hereinafter referred to as "resistance method"), a method for sensing a location at which electrostatic capacity is varied (hereinafter referred to as "electrostatic capacity method"), a method for sensing a location at which an amount of light is varied (hereinafter referred to as "optical method", and the like.

In the optical method, a difference in reflectance of light corresponding to a difference in a refractive index of each location of a medium that contacts a surface of a panel is sensed to sense touches or patterns of fingerprints. For instance, in an area not touched by skin, the internal light is reflected at high reflectance and input to a light-receiving device corresponding to the area. In an area contacted by skin, a large amount of the internal light is transmitted or absorbed, and only a small amount of the internal light is input to a light-receiving device corresponding to the area contacted by skin. In this case, a difference in amounts of light is sensed to recognize a pattern of a finger print, or a touch.

In the optical method, signal light generated in a panel as well as noise light from the outside of a panel may be input to the light-receiving device. In this case, there is a need for a method of improving a signal-to-noise ratio by increasing a ratio of noise light to signal light.

SUMMARY

Accordingly, the present disclosure is directed to a display apparatus including a light-receiving device that substantially obviates one or more of problems due to limitations and disadvantages of the prior art.

The present disclosure provides a display apparatus including an in-cell type light-receiving device, which may enhance a signal-to-noise ratio.

The present disclosure is not limited to what has been described. Other objectives and advantages that have not been mentioned may be clearly understood from the following description and may be more clearly understood from aspects set forth herein. Further, it will be understood that the objectives and advantages of the present disclosure may be realized via means and a combination thereof that are described in the appended claims.

According to aspects of the present disclosure, a display apparatus may include a substrate above which a thin-film transistor array is disposed, a plurality of electro-luminescence devices disposed above the thin-film transistor array and are electrically connected to the thin-film transistor, a plurality of light-receiving devices disposed above the thin-film transistor array and are spaced apart from the plurality of electro-luminescence devices and are electrically connected to the thin-film transistor, a plurality of light shield patterns shielding the plurality of light-receiving devices, and at least one opening pattern arranged in each light shield pattern and including a predetermined opening direction.

Each light shield pattern may include a protruding area that corresponds to an edge of each light shield pattern and protrudes than each light-receiving device.

The display apparatus may further include a transparent cover disposed above the plurality of light shield patterns.

Each light-receiving device may absorb at least a portion of light generated from an effective light-receiving area corresponding to each opening pattern in an upper surface of the transparent cover.

Each opening pattern may be disposed in a protruding area of each light shield pattern.

A minimum angle (an opening pattern minimum available incidence angle) among angles between lines connecting an edge of each opening pattern to an edge of each light-receiving device and a normal line of an upper surface of the transparent cover is greater than a predetermined critical angle, and the predetermined critical angle is determined by at least one of the transparent cover and a medium in contact with the upper surface of the transparent cover.

The plurality of light shield patterns further shield a portion of the plurality of electro-luminescence devices, and the opening pattern of the light shield pattern of one electro-luminescence device among the plurality of electro-luminescence devices and the opening pattern of the light shield pattern of one light-receiving device among the plurality of light-receiving devices may correspond to each other in a predetermined opening direction.

At least a portion of the plurality of light shield patterns may include a plurality of opening patterns.

The plurality of electro-luminescence devices may further include a first electrode, a bank that covers an edge of the first electrode, an electro-luminescence layer that is disposed above the first electrode, and a second electrode that covers the electro-luminescence layer.

The bank may be made of a light-absorbing insulating material. A plurality of opening patterns may overlap with the banks.

The display apparatus may further include the transparent cover disposed above the plurality of electro-luminescence devices and the plurality of light-receiving devices.

An electro-luminescence device and a light-receiving device corresponding to each other in the predetermined opening direction may be spaced apart from each other by a predetermined distance.

The electro-luminescence device is shielded by a plurality of light shield patterns, and minimum available incidence angle of the plurality of light shield patterns may further extend from a critical angle.

At least one electro-luminescence device and/or at least one light-receiving device may be further provided between the electro-luminescence device and the light-receiving device corresponding to each other among the plurality of electro-luminescence devices and the plurality of light-receiving devices.

The display panel may be a flexible display panel and the transparent cover may be determined in consideration of the properties of the flexible display panel.

At least one electro-luminescence device among the plurality of electro-luminescence devices may directly correspond to the plurality of light-receiving devices.

At least one of the plurality of light shield patterns may include a plurality of opening patterns.

At least one of the plurality of light shield patterns may include the plurality of grooves.

The at least one light shield pattern may output the light at the same time in different directions through the plurality of opening patterns.

The amount of light totally reflected, which was output at the same time in different directions from one another may be sensed at a plurality of coordinates.

According to aspects of the present disclosure, the display apparatus may include a substrate above which the thin-film transistor array is disposed, a plurality of electro-luminescence devices that are disposed above the thin-film transistor array and are electrically connected to the thin-film transistor, a plurality of light-receiving devices that are disposed above the thin-film transistor array, and are spaced apart from the plurality of electro-luminescence devices, and are electrically connected to the thin-film transistor, a plurality of light shield patterns that shield a portion of the plurality of electro-luminescence devices and the plurality of light-receiving devices, and a plurality of grooves that are formed in the plurality of light shield patterns and have a predetermined opening direction. The display apparatus may optionally include the groove or the opening pattern.

The plurality of grooves may include an area in which a portion of a rim of the plurality of light shield patterns is concave.

The shapes of the plurality of grooves may include at least one shape of a straight line and a curved line.

According to aspects of the present disclosure, the display apparatus includes a plurality of light shield patterns that are disposed above a transparent encapsulating unit that covers a plurality of electro-luminescence devices and a plurality of light-receiving devices and overlap with the plurality of light-receiving devices, and an opening pattern that passes through each light shield pattern.

Due to each light shield pattern that is overlapped with each light-receiving device, it is possible to minimize the incidence of noise light outside and/or inside of the apparatus on each light-receiving device. The noise light refers to the remainder excluding the signal light that is required for sensing the touch and/or the fingerprint.

The opening pattern is intended to maximize a level of the signal to noise ratio by selecting the incident angle of the light incident on the light-receiving device. Accordingly, there is an effect that the optical noise may be reduced to implement functions such as the fingerprint sensing and/or the touch sensing.

In addition, a shape and a size of the effective light-receiving area determined by a geometrical structure of the opening pattern, the light-receiving device, and the transparent cover may be property selected, thereby improving accuracy in providing the pattern of a sensed object, such as fingerprint pattern of the finger or a contact area of the finger.

Further, the light shield pattern corresponding to one electro-luminescence device includes one or a plurality of opening patterns, thereby increasing resolution of fingerprint recognition.

As described above, a structure in which the plurality of light-receiving devices and the plurality of electro-luminescence devices are disposed above the same substrate is provided, that is, the light-receiving device is provided in the in-cell type to remove a separate sensor module, thereby having a simple structure of the display apparatus.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
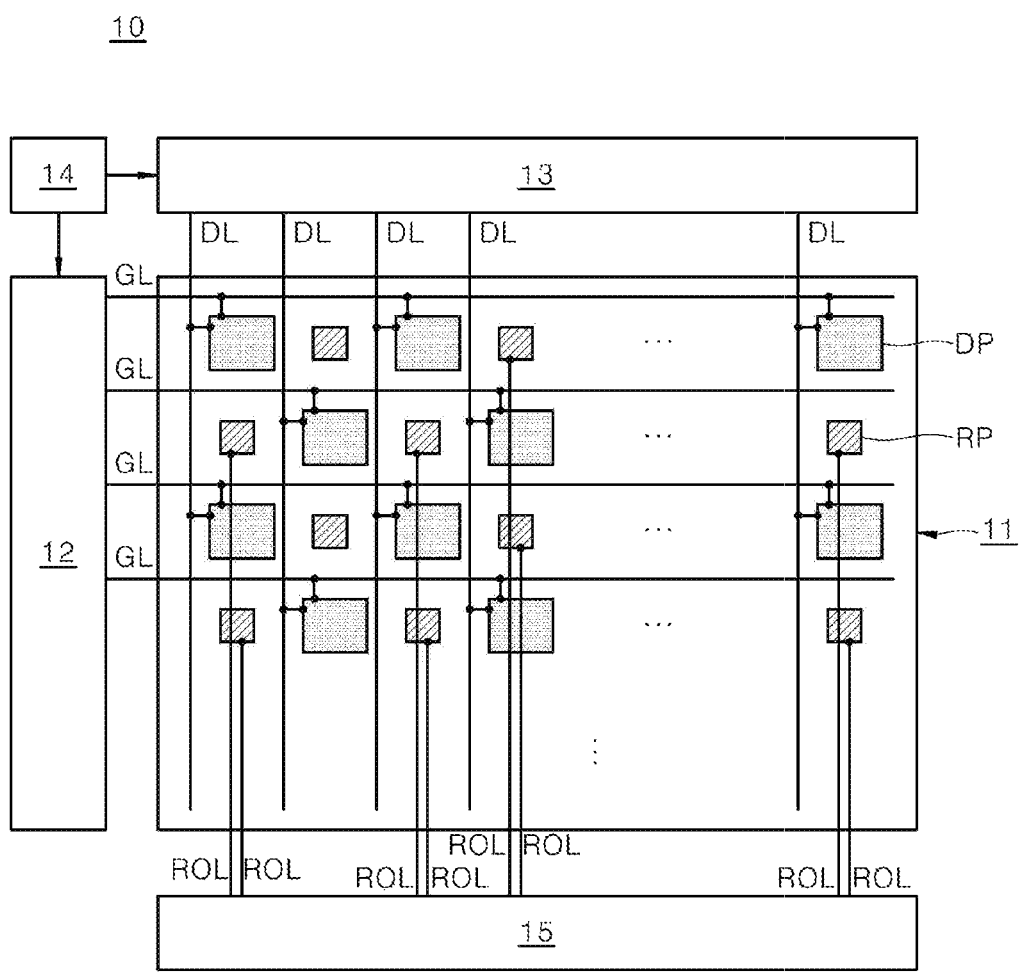
FIG. 1 shows a display apparatus according to a first aspect of the present disclosure.

The above-described aspects, features and advantages are specifically described hereunder with reference to the attached drawings. Accordingly, one having ordinary skill in the art may readily implement the technical spirit of the present disclosure. Further, in describing the present disclosure, publicly-known technologies in relation to the disclosure are not specifically described if they are deemed to make the gist of the disclosure unnecessarily vague. Below, aspects are described with reference to the attached drawings. In the drawings, like reference numerals denote like or similar elements.

Below, a display apparatus according to each aspect is described with reference to the attached drawings.

With reference to FIGS. 1 to 6, a display apparatus according to a first aspect is described.

Figure 2:
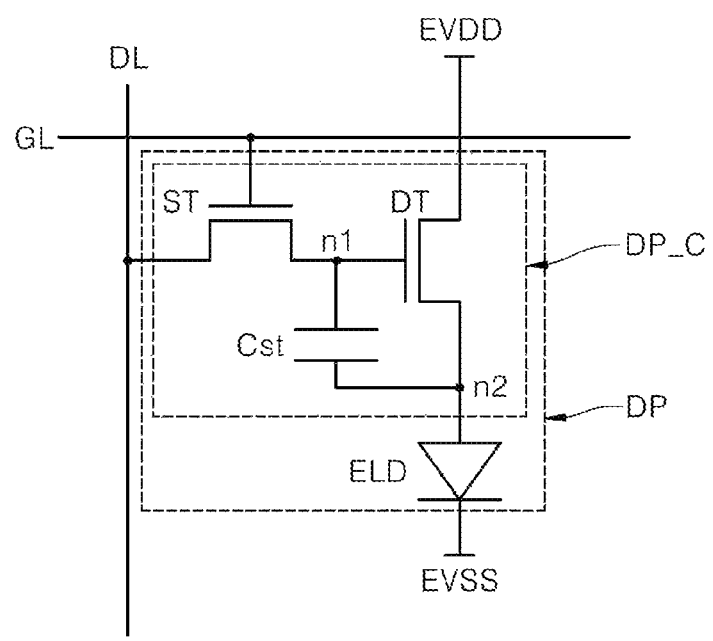
FIG. 2 shows an equivalent circuit that corresponds to a display pixel area in FIG. 1.
Figure 3:
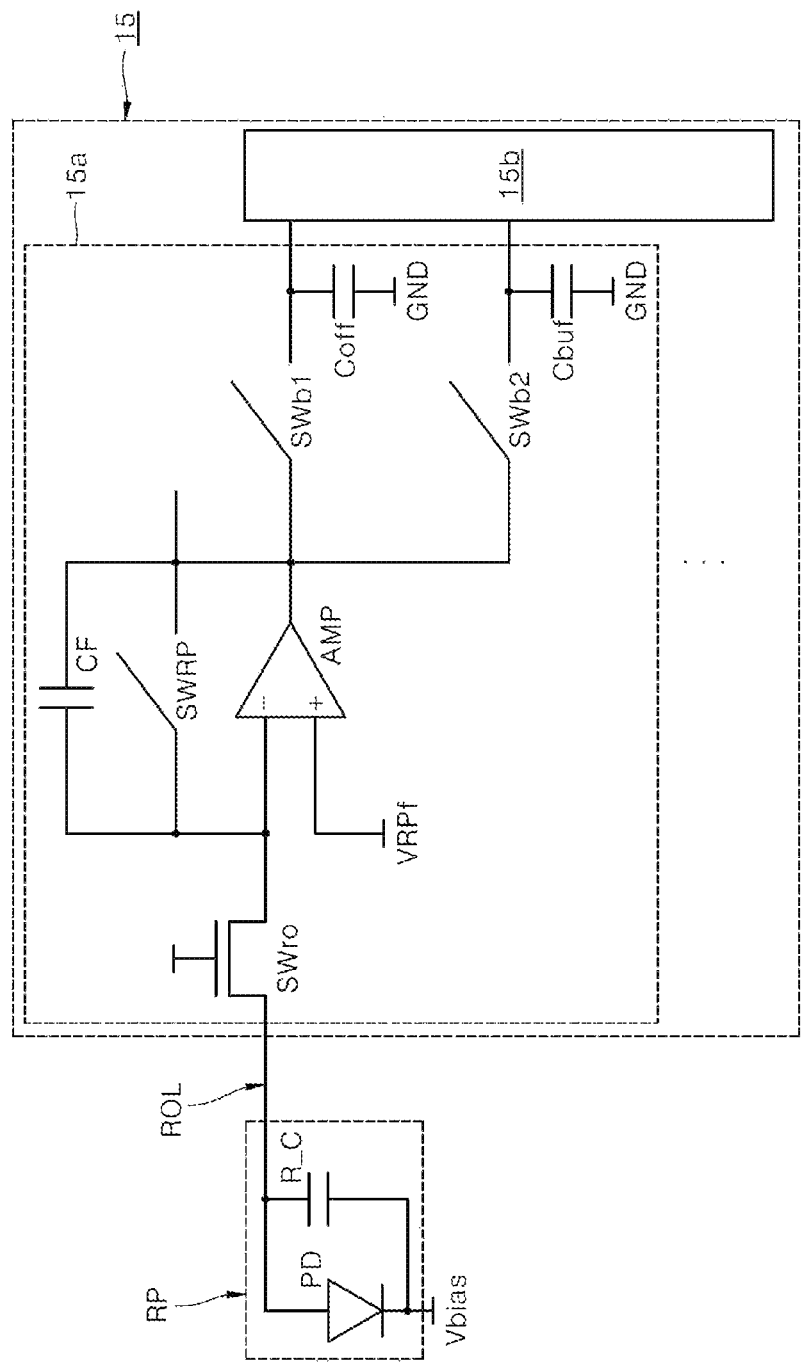
FIG. 3 shows an equivalent circuit that corresponds to a part of a light-receiving pixel area and a readout driving unit of FIG. 1.

FIG. 1 shows a display apparatus according to a first aspect, FIG. 2 shows an equivalent circuit that corresponds to the display pixel area in FIG. 1, and FIG. 3 shows an equivalent circuit that corresponds to a part of the light-receiving pixel area and the readout driving unit in FIG. 1.

Figure 4:
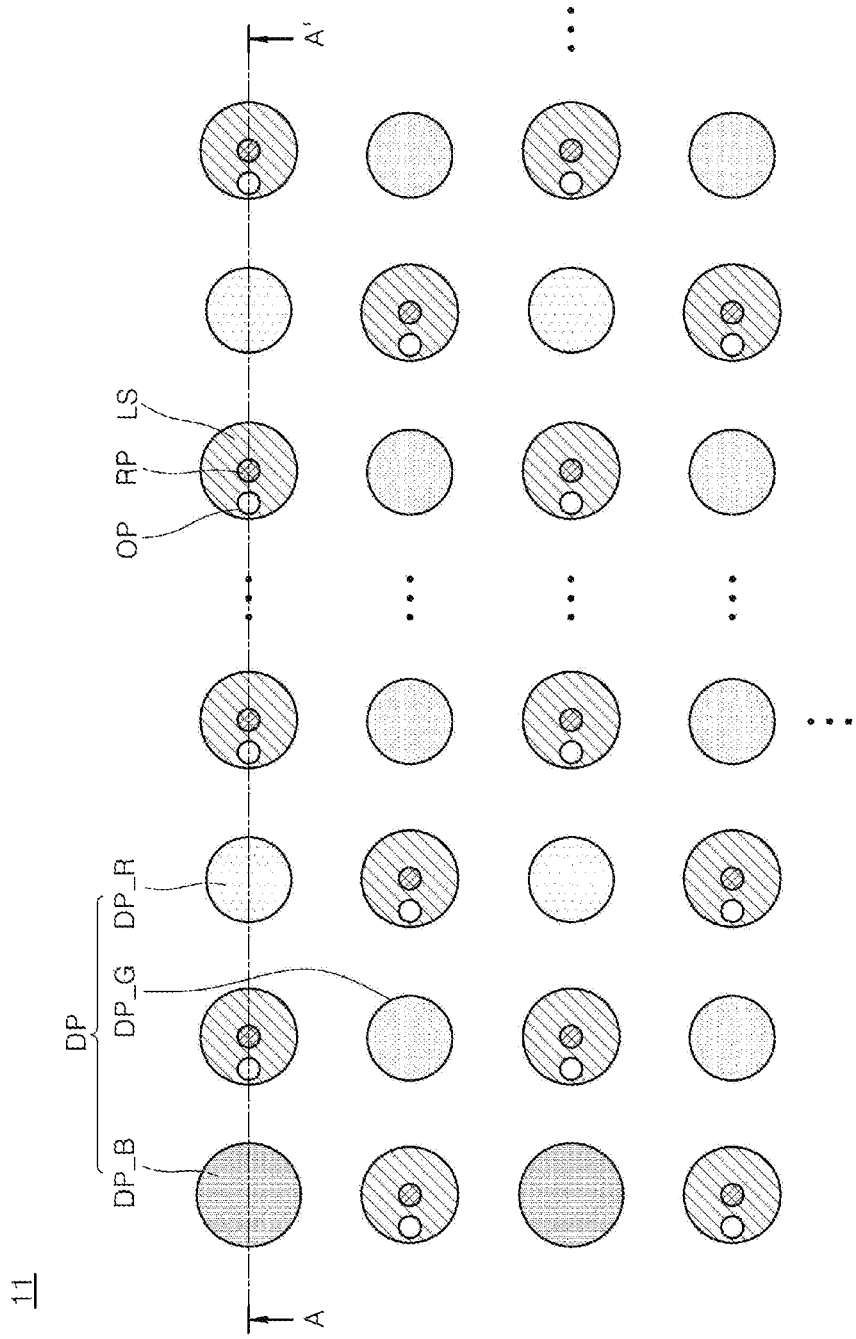
FIG. 4 shows a state in which a plurality of display pixel areas, a plurality of light-receiving pixel areas, a plurality of light shield patterns and a plurality of opening patterns are disposed in a display area of FIG. 1.
Figure 5:
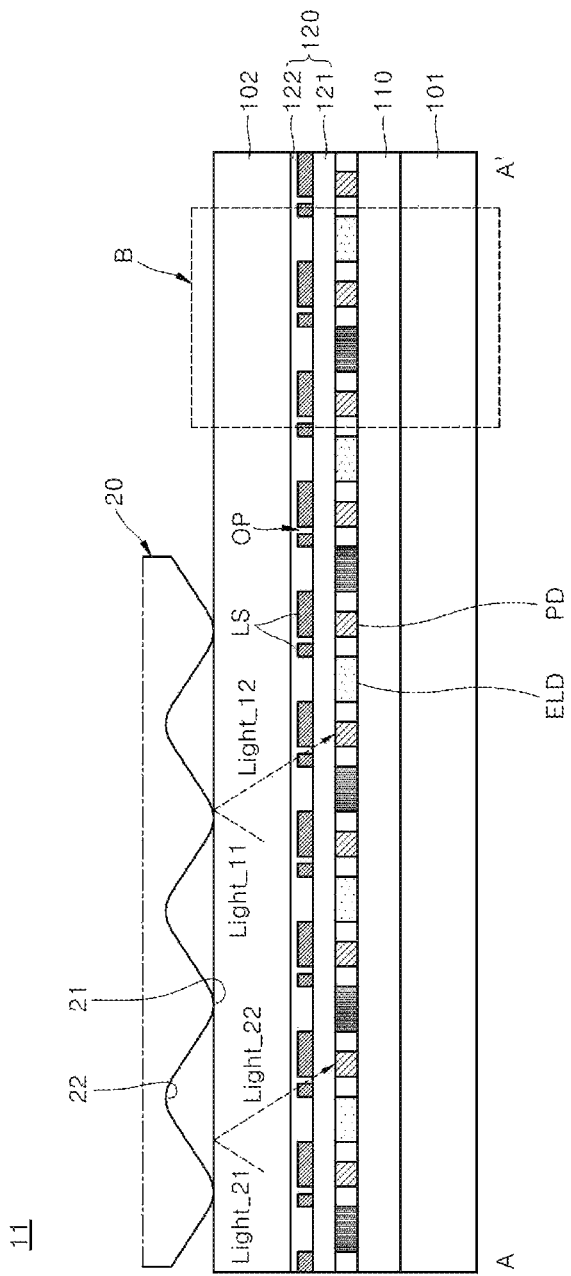
FIG. 5 shows a cross-sectional view of a display panel, which corresponds to area A-A' of FIG. 4.
Figure 6:
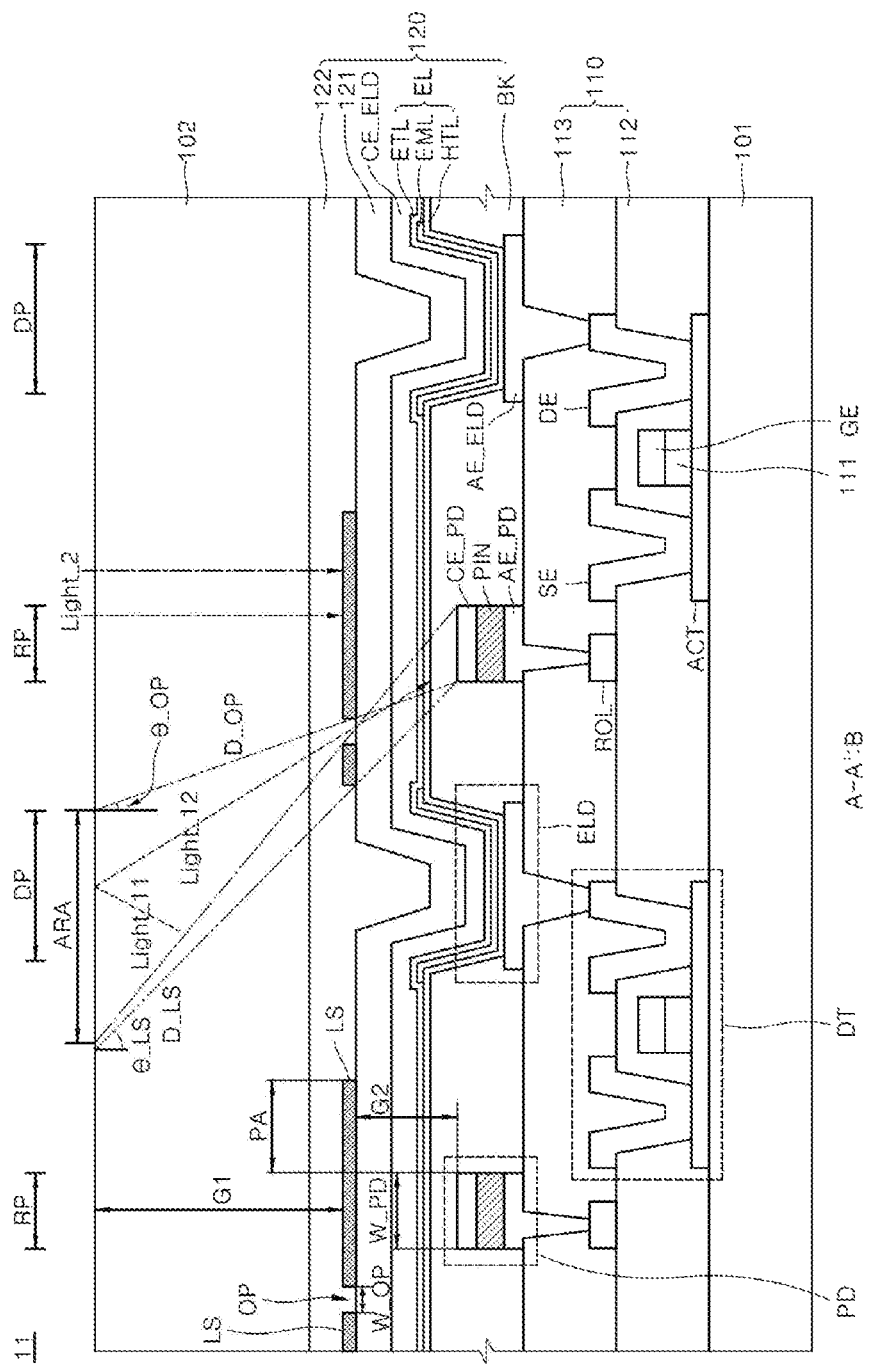
FIG. 6 shows area B in FIG. 5.

FIG. 4 shows a state in which a plurality of display pixel areas, a plurality of light-receiving pixel areas, a plurality of light shield patterns, and opening patterns are arranged in the display area in FIG. 1. FIG. 5 shows a cross-sectional view of a display panel, which corresponds to area A-A' in FIG. 4, and FIG. 6 shows area B in FIG. 5.

As illustrated in FIG. 1, a display apparatus 10 according to a first aspect of the present disclosure includes a display panel 11 that has a display area in which an image is displayed, and a panel driving unit (12, 13, 14, and 15) that drives the display panel 11.

The display panel 11 includes a light-emitting material or a liquid crystal material that is disposed over a substrate. A display area of the display panel 11 includes a thin-film transistor array that drives the plurality of display pixel areas (DP) to display an image. The thin-film transistor array includes a plurality of thin-film transistors that correspond to the plurality of display pixel areas (DP), and various signal lines.

Additionally, a plurality of display pixel areas (DP), and a plurality of light-receiving pixel areas (RP) for sensing shapes of finger prints or locations of touches in an optical manner are disposed in the display area of the display panel 11.

Accordingly, the plurality of display pixel areas (DP) and the plurality of light-receiving pixel areas (RP) are arranged in the display area of the display panel 11.

The display panel 11 may include a plurality of electro-luminescence devices (ELD shown in FIG. 2) that correspond to the plurality of display pixel areas (DP), and a plurality of light-receiving devices (PD shown in FIG. 3) that correspond to the plurality of light-receiving pixel areas (RP).

The plurality of electro-luminescence devices (ELD) and the plurality of light-receiving devices (PD) are disposed above the thin-film transistor array (110 shown in FIG. 5).

The thin-film transistor array 110 of the display panel 11 includes gate lines (GL) and data lines (DL) that connect to the plurality of display pixel areas (DP), and readout lines (ROL) that connect to the plurality of light-receiving pixel areas (RP).

For example, each gate line (GL) may be connected to the display pixel areas of each horizontal line that is horizontally arranged, among the plurality of display pixel areas DPs. Each data line (DL) may be connected to the display pixel areas of each vertical line that is vertically arranged among the plurality of display pixel areas DPs. Each readout line (ROL) may be connected to each light-receiving pixel area (RP). However, this is only an example, and types and arrangements of signal lines such as gate lines (GL), data lines (DL) and readout lines (ROL) may vary depending on a driving method of the plurality of display pixel areas (DP) and a driving method of the plurality of light-receiving pixel areas (RP).

The panel driving unit (12, 13, 14, and 15) may include a gate driving unit 12 that drives the gate line (GL), a data driving unit 13 that drives the data line (DL), a timing controller 14 that controls timing of driving the gate driving unit 12 and the data driving unit 13, and a readout driving unit 15 that drives the readout line (ROL).

For instance, the gate driving unit 12 consecutively supplies gate signals to the gate line (GL) on the basis of gate driving initiation signals and gate clock signals of the timing controller 14. In this case, a switching thin-film transistor (ST shown in FIG. 2) of the display pixel area (DP) is turned on, based on the gate signals.

The data driving unit 13 supplies data signals of each display pixel area (DP) to each data line (DL) on the basis of data driving initiation signals and data clock signals of the timing controller 14.

The readout driving unit 15 performs readout of detection signals from each light-receiving pixel area (RP).

As illustrated in FIG. 2, each display pixel area (DP) includes an electro-luminescence device (ELD), and a pixel circuit (DP_C); a drive circuit part of a display pixel) for supplying driving current to the electro-luminescence device (ELD).

The pixel circuit (DP_C) includes a driving transistor (DT) that is disposed in series with the electro-luminescence device (ELD) between a first driving power supply line (EVDD) and a second driving power supply line (EVSS), a switching transistor (ST) that is disposed between the driving transistor (DT) and the data line (DL), and a storage capacitor (Cst) that is disposed between a first node (n1) and a second node (n2). The first node (n1) is disposed between a gate electrode of the driving transistor (DT), and the switching transistor (ST), and the second node (n2) is disposed between the driving transistor (DT) and the electro-luminescence device (ELD).

In the pixel circuit (DP_C), when the switching transistor (ST) is turned on, based on gate signals of the gate line (GL), the switching transistor (ST) delivers data signals of the data line (DL) to the first node (n1). The storage capacitor (Cst) is charged based on the data signals. In this case, the driving transistor (DT) is turned on, based on charging voltage of the storage capacitor (Cst), and driving current generated by the turned-on driving transistor (DT) is supplied to the electro-luminescence device (ELD).

However, this is only an example and the pixel circuit (DP_C) may have a structure in which a compensating circuit that compensates a threshold voltage deviation (AVth) of the driving transistor (DT) and the like are further included.

However, this is only an example. The pixel circuit (DP_C) may be implemented as at least one of an NMOS transistor, a PMOS transistor and/or a CMOS transistor.

As illustrated in FIG. 3, each light-receiving pixel area (RP) includes a light-receiving device (PD; a pin diode). Additionally, each light-receiving pixel area (RP) may further include a light-receiving capacitor (R_C) that connects in parallel to the light-receiving device (PD). The light-receiving capacitor (R_C) may be a parasitic capacitor of the light-receiving device (PD).

The light-receiving device (PD) connects between a bias power supply line (Vbias) and the readout line (ROL). For example, when incident light is input to the light-receiving device (PD), electron-hole pairs are generated in a P-I-N junction of the light-receiving device (PD) in response to the incident light. In this case, electrons of the electron-hole pairs move on the basis of a bias power supply (Vbias). Accordingly, detection signals that correspond to an amount of light input to the light-receiving device (PD) may be generated.

The readout driving unit 15 may include a data detecting unit (15a) that corresponds to each readout line (ROL), and a detected image signal generating unit 15b that generates a detected image signal on the basis of output of the data detecting unit (15a).

The data detecting unit 15a may include an amplifier (AMP) that corresponds to each readout line (ROL), a readout switch (SWro) that is disposed between the readout line (ROL) and the amplifier (AMP), a feedback capacitor (Cf) and a feedback reset switch (SWre) that correspond to the amplifier (AMP), an offset capacitor (Coff) and a buffer capacitor (Cbuf) that correspond to an output terminal of the amplifier (AMP), a 1st buffer switch (SWb1) that is disposed between the amplifier (AMP) and the offset capacitor (Coff), and a 2nd buffer switch (SWb2) that is disposed between the amplifier (AMP) and the buffer capacitor (Cbuf).

A first input terminal (−) of the amplifier (AMP) may connect with the readout line (ROL) through the readout switch (SWro). Accordingly, when the readout switch (SWro) is turned on, detection signals that correspond to each light-receiving pixel area (RP) may be input to the first input terminal (−) of the amplifier (AMP) through the readout line (ROL).

Predetermined reference signals (Vref) may be input to a second input terminal (+) of the amplifier (AMP).

The feedback capacitor (Cf) may be disposed between the first input terminal (−) and the output terminal of the amplifier (AMP). Accordingly, gain between the first input terminal (−) and the output terminal of the amplifier (AMP) may correspond to capacitance of the feedback capacitor (Cf).

The feedback reset switch (SWre) may be disposed in parallel with the feedback capacitor (Cf) between the first input terminal (−) and the output terminal of the amplifier (AMP). When the feedback reset switch (SWre) is provided, there is an effect of detecting offset signals that correspond to noise of the amplifier (AMP).

When the feedback reset switch (SWre) and the 1st buffer switch (SWb1) are turned on in the state in which the readout switch (SWro) is turned off, the offset capacitor (Coff) may be charged based on offset signals that correspond to noise of the amplifier (AMP). This operation in which the offset capacitor (Coff) is charged based on the offset signal may be performed during a period for initialization which is carried out before each of the sensing periods in the data detecting unit 15a corresponding to the entire readout line (ROL).

When the readout switch (SWro) is turned on, detection signals of each light-receiving pixel area (RP) may be input to the first input terminal (−) of the amplifier (AMP), and amplified detection signals may be output from the output terminal of the amplifier (AMP). Additionally, when the 2nd buffer switch (SWb2) is turned on, the buffer capacitor (Cbuf) may be charged based on the amplified detection signals.

The detected image signal generating unit 15b connects to the offset capacitor (Coff) and the buffer capacitor (Cbuf), and may generate detected image signals on the basis of offset signals and amplified detection signals that are output from each data detecting unit 15a. For instance, the detected image signal generating unit 15b may generate a brightness level signal that corresponds to an amount of light input to each light-receiving pixel area (RP) on the basis of offset signals and amplified detection signals output from each data detecting unit 15a, and may generate detected image signals based on a combination of a plurality of brightness level signals that correspond to the plurality of light-receiving pixel areas (RP).

However, the data detecting unit 15a is an exemplary circuit diagram, and the present disclosure is not limited to this. That is, a few aspects of the present disclosure may include data detecting units that are modified in different forms to perform substantially the same functions.

As illustrated in FIG. 4, a display panel 11 includes a plurality of display pixel areas (DP) and a plurality of light-receiving pixel areas (RP) that are arranged in a matrix form in a display area in which an image is displayed. Additionally, the display panel 11 further includes a plurality of light shield patterns (LS) that overlap a plurality of light-receiving devices (PD) corresponding to the plurality of light-receiving pixel areas (RP) and an opening pattern (OP) that is arranged in each light shield pattern (LS).

The plurality of display pixel areas (DP) may include a red display pixel area (DP_R) in which red light is emitted, a green display pixel area ((DP_G) in which green light is emitted, and a blue display pixel area (DP_B) in which blue light is emitted.

In this case, an electro-luminescence device (ELD in FIG. 2) that corresponds to each display pixel area (DP) may be a device that emits any one of a red color, a green color and a blue color.

That is, an electro-luminescence layer of an electro-luminescence device (ELD shown in FIG. 2) that corresponds to the red display pixel area (DP_R) may include a dopant or a host that corresponds to a red color.

Likewise, an electro-luminescence layer of an electro-luminescence device (ELD shown in FIG. 2) that corresponds to the green display pixel area (DP_G) may include a dopant or a host that corresponds to a green color.

Additionally, an electro-luminescence layer of an electro-luminescence device (ELD shown in FIG. 2) that corresponds to the blue display pixel area (DP_B) may include a dopant or a host that corresponds to a blue color.

A plurality of electro-luminescence devices (ELD shown in FIG. 2) that correspond to the plurality of display pixel areas (DP) may be a device that emits white light. In this case, the display panel 11 may further include a color filter that corresponds to each display pixel area (DP).

That is, the display panel 11 may further include a red color filter that corresponds to the red display pixel area (DP_R), a green color filter that corresponds to the green display pixel area ((DP_G), and a blue color filter that corresponds to the blue display pixel area (DP_B).

Each light-receiving pixel area (RP) may be disposed between two adjacent display pixel areas (DP).

Additionally, the plurality of light-receiving pixel areas (RP) may be disposed to alternate with at least one display pixel area (DP) that is arranged in parallel in a specific direction among the plurality of display pixel areas (DP). For example, the display pixel area (DP) and the light-receiving pixel area (RP) may be arranged in the specific pattern.

For example, as illustrated in FIG. 4, a display pixel area (DP) and a light-receiving pixel area (RP) may be alternately disposed horizontally and vertically in a particular pattern.

However, this is only an example. Each light-receiving pixel area (RP) may be disposed between one or more display pixel areas (DP) in a horizontal direction, a perpendicular direction, and a diagonal direction.

However, this is only an example. One display pixel area (DP) and one light-receiving pixel area (RP) may be alternately disposed in the specific pattern in a diagonal direction.

A gap in which the light-receiving pixel areas (RP) are arranged may be adjusted on the basis of an object subject to sensing. For example, a gap in which the light-receiving pixel areas (RP) are arranged may be less than that between ridges of a fingerprint to implement the function of sensing a fingerprint. For example, an accurate and fine degree of the light-receiving pixel area (RP) may be 300 dpi (dpi; dots per inch) or more, and particularly, may be 400 dpi or more.

Referring to FIG. 5, a display panel 11 includes a substrate 101, a thin-film transistor array 110 that is disposed over the substrate 101, a device array 120 that disposed above the thin-film transistor array 110, and a light shield pattern (LS) and an opening pattern (OP) that are disposed above the device array 120.

The thin-film transistor array 110 includes a plurality of thin-film transistors (ST and DT shown in FIG. 2) that correspond to a plurality of display pixel areas (DP shown in FIG. 1).

When a plurality of light-receiving pixel areas (RP shown in FIG. 1) are driven in an active matrix manner, the thin-film transistor array 110 may further include a plurality of thin-film transistors that correspond to the plurality of light-receiving pixel areas (RP). That is, the thin-film transistor array 110 may further include signal lines and thin film transistors that drive the plurality of light-receiving pixel areas (RP).

The device array 120 includes a plurality of electro-luminescence devices (ELD) that correspond to the plurality of display pixel areas (DP shown in FIG. 1), and a plurality of light-receiving devices (PD) that correspond to the plurality of light-receiving pixel areas (RP shown in FIG. 1).

A transparent encapsulating unit 121 is disposed above the plurality of electro-luminescence devices (ELD) and the plurality of light-receiving devices (PD).

A plurality of light shield patterns (LS) overlapping the plurality of light-receiving devices (PD) are disposed above the transparent encapsulating unit 121. Each light shield pattern (LS) covers at least one light-receiving device (PD). The light shield pattern (LS) may include a light absorbing material or a light shield material. For example, the light shield pattern (LS) may be made of a black resin or formed of a metal layer, but is not limited thereto.

The plurality of light shield patterns LSs have a width enough to shield unnecessary light that may be incident on the plurality of light-receiving devices (PD). That is, each light shield pattern (LS) corresponding to each light-receiving device (PD) has a width greater than that of each light-receiving device (PD). Thus, when viewed from above, each light-receiving device (PD) is completely covered by each light shield pattern (LS).

The opening pattern (OP) penetrates a portion of each light shield pattern (LS). That is, the opening pattern (OP) may be a portion of the light shield pattern (LS) that is removed by patterning. The opening pattern (OP) functions to select the light of a specific incident angle to be incident on each light-receiving device (PD). At least a portion of the light (Light_12) passing through the opening pattern (OP) is incident on the light-receiving device (PD).

When the opening pattern (OP) has a circular shape, there is an advantage that a diffraction phenomenon occurring when light passes through the opening pattern (OP) may be reduced. The diffraction phenomenon may be a factor that enables degrading a sensing sensitivity. However, according to the present disclosure, the shape of the opening pattern (OP) is not limited to the circular shape, and it is needless to say that the opening pattern (OP) may be deformed into a shape other than a circular shape.

A transparent cover 102 may be disposed above the plurality of light shield patterns (LS). The transparent cover 102 may include a material such as glass, reinforced glass, reinforced plastics and the like that may protect the display panel 11.

An insulating layer 122 may be further disposed between the plurality of light shield patterns (LS) and the transparent cover 102. However, the present disclosure is not limited to what has been described.

Some of the light emitted from the electro-luminescence device (ELD) may be emitted outward through an upper surface of the transparent cover 102. The other portion of the light emitted from the electro-luminescence device (ELD) may be scattered or reflected toward the light-receiving device (PD), that is, to an inside of the panel, from the upper surface of the transparent cover 102 in contact with a predetermined medium.

At least a part (Light_12) of light (Light_11) in the transparent cover 102 reflects toward the light-receiving device (PD) in an interface between the upper surface of the transparent cover 102 and air.

In particular, an amount of the light (Light_12) that reflects toward the light-receiving device (PD) in each position of the upper surface of the transparent cover 102, as described above, is determined on the basis of a refractive index of a medium (e.g., air, skin and the like) that contacts the upper surface of the transparent cover 102. In other words, an amount of light (Light_12) that reflects toward the inside of the panel may differ depending on whether the area in the panel is touched by a finger.

Prints of a finger 20 have ridges that have specific patterns. Accordingly, ridge parts 21 of a finger 20 contact the upper surface of the transparent cover 102, but spaced parts 22 between the ridges do not contact the transparent cover 102, in the state in which the finger 20 contacts the upper surface of the transparent cover 102. That is, in the ridge parts 21, the upper surface of the transparent cover 102 contacts skin 20, but in the spaced parts 22 between the ridges, the upper surface of the transparent cover 102 contacts air.

In this case, the skin 20 has a different refractive index from air. Accordingly, an amount of light (Light_12) that reflects in an area of the upper surface of the transparent cover 102, which contacts the ridge parts 21, is different from an amount of light (Light_22) that reflects in an area of the upper surface of the transparent cover 102, which contacts the spaced parts 22 between the ridges.

Additionally, most of the light passes through the skin or is absorbed in the skin in the area that contacts the ridge parts 21, and the rest of the light may reflect.

Thus, the ridge parts 21 of the finger print 20 and the spaced parts 22 between the ridges may be drawn on the basis of a difference in amounts of light (Light_12 and Light_22) that is input to each light-receiving device (PD).

As illustrated in FIG. 6, a display panel 11 includes a thin-film transistor array 110 that is disposed above a substrate 101, a plurality of electro-luminescence devices (ELD) that are disposed above the thin-film transistor array 110 and that correspond to a plurality of display pixel areas (DP), a plurality of light-receiving devices (PD) that are disposed above the thin-film transistor array 110 and that correspond to a plurality of light-receiving pixel areas (RP), and a plurality of light shield patterns (LS) that are disposed above a transparent encapsulating unit 121 covering the plurality of electro-luminescence devices (ELD) and the plurality of light-receiving devices (PD) and that are overlapped with the plurality of light-receiving devices (PD), and an opening pattern (OP) that passes through each light shield pattern (LS).

Width of each of the light shield patterns (LS) is greater than that of each of the light-receiving devices (PD).

That is, each light shield pattern (LS) includes a protruding area PA that corresponds to an edge of each light shield pattern (LS) and horizontally protrudes from each light-receiving device (PD).

The opening pattern (OP) is disposed at least a portion of each light shield pattern (LS).

For example, the opening pattern (OP) may be disposed at a portion of the protruding area PA of each light shield pattern (LS).

Alternatively, the opening pattern (OP) may overlap with at least a portion of each light-receiving device (PD). That is, a portion of the opening pattern (OP) may be overlapped with each light-receiving device (PD), and the remaining portion thereof may be overlapped with the protruding area PA of each light shield pattern (LS).

Each light-receiving device (PD) senses the light incident through the opening pattern (OP) formed in each light shield pattern (LS).

When necessary, the protruding area PA of each light shield pattern (LS) has a sufficient protruding length in all directions, so that among light that is input from the outside of the panel (hereinafter referred to as "external light") and light that is generated in the panel by the plurality of electro-luminescence devices (ELD) and the like (hereinafter referred to as "internal light"), light that reflects from the upper surface of the transparent cover 102, i.e., from an area except for an effective light-receiving area, reaches the light-receiving device (PD) to a minimum degree, thereby improving the signal to noise ratio.

A collection of points at which extension lines that connect an edge of each opening pattern (OP) and an edge of each light-receiving device (PD) meet the upper surface of the transparent cover 102 draws a closed curve. In this case, an inner area of a closed curve with a largest possible surface area is defined as 'an effective light-receiving area ARA'. The effective light-receiving area (ARA) may have a proper size and shape to correspond to a size and shape of a pattern to be sensed. For instance, the effective light-receiving area (ARA) for sensing a fingerprint and a touch may have a proper size and shape on the basis of a distance and a size of each pattern to be sensed.

For example, the effective light-receiving area (ARA) corresponding to each light-receiving device (PD) and each opening pattern (OP) may correspond to a distance (G1) between the upper surface of the transparent cover 102 and the opening pattern (OP), a distance G2 between the opening pattern (OP) and the light-receiving device (PD), a width (W_OP) of the opening pattern (OP), and a width (W_PD) of the light-receiving device.

Among the lines that connect the edge of the light shield pattern (LS) and the edge of the light-receiving device (PD), a line that forms a minimum angle together with a normal line of the upper surface of the transparent cover 102 is defined as a light-shield-pattern available minimum incidence path (D_LS). An angle (θ_LS) that is formed by the light-shield-pattern available minimum incidence path and the normal line of the upper surface of the transparent cover 102 may be set to be greater than a predetermined critical angle. The predetermined critical angle is determined by at least one of the transparent cover 102 and a medium that contacts the transparent cover 102. For instance, a critical angle with respect to the light-shield-pattern available minimum incidence angle may be determined on the basis of a range of incidence angels that are selected as noise light or a range of incidence angel that is selected as signal light. By doing so, the light shield pattern (LS) may minimize input of external light to the light-receiving device (PD), thereby improving a signal-to-noise ratio in relation to external light. When the light-shield-pattern available minimum incidence angle becomes smaller, input of noise light that is unnecessary for sensing a touch and/or a fingerprint, among inner light, to the light-receiving device may be further reduced, and a signal-to-noise ratio in relation to noise light may be further increased.

Among the lines that connect the edge of the opening pattern (OP) and the edge of light-receiving device (PD), a line that forms a minimum angle together with a normal line of the upper surface of the transparent cover 102 is defined as an opening pattern available minimum incidence path (D_OP). An angle (θ_OP) (hereinafter referred to as "an opening pattern available minimum incidence angle") that is formed by the opening pattern available minimum incidence path (D_OP) and the normal line of the upper surface of the transparent cover 102 is greater than a predetermined critical angle. The predetermined critical angle is determined by at least one of the refractive index of the transparent cover 102 and the refractive index of the medium (for example, air) that contacts the upper surface of the transparent cover 102. Then, the critical angle with respect to the opening pattern available minimum incidence angle (θ_OP) may be set based on the range of the incident angle of the signal light.

For example, the critical angle with respect to the opening pattern available minimum incidence angle (θ_OP) may correspond to the total reflection on the upper surface of the transparent cover 102 in contact with air. In this case, as the signal light incident on the light-receiving device (PD) may be limited to the light totally reflected from the upper surface of the transparent cover 102, thereby improving the signal to noise ratio.

In other words, among lines that connect an edge of the light shield pattern (LS) and an edge of the light-receiving device (PD), a line that forms a minimum angle together with a normal line of an upper surface of the transparent cover 102 is referred to as a light-shield-pattern available minimum incidence path (D_LS). When necessary, an angle (θ_LS) (hereinafter referred to as "light-shield-pattern available minimum incidence angle") that is formed by the light-shield-pattern available minimum incidence path (D_LS) and the normal line of the upper surface of the transparent cover 102 may be greater than a predetermined critical angle. The predetermined critical angle is determined by at least one of the transparent cover and a medium that contacts the upper surface of the transparent cover.

For instance, when the light-shield-pattern available minimum incidence angle (θ_LS) is set to the same angle as a critical angle, input of reflected light of an angle less than or equal to an incidence angle in the panel as well as external light to the light-receiving device (PD) may be minimized. When the light-shield-pattern available minimum incidence angle (θ_LS) extends further than a critical angle, input of unnecessary light of total internal reflection, which proceeds in the panel, to the light-receiving device (PD) may also be minimized, thereby improving a signal-to-noise ratio in relation to external light as well as internal noise light.

When an external angle of the light shield pattern (LS) is sufficiently greater than that of the light-receiving device (PD), the range of angle of the light reaching the light-receiving device (PD) is determined based on a geometric form of the opening pattern (OP) and a geometrical form of the light-receiving device (PD) and relative positions of two forms. At this time, a minimum value and a maximum value of the angle formed by the lines connecting the edges of the opening pattern (OP) and the edges of the light-receiving device (PD) and the normal line of the upper surface of the transparent cover 102 are referred to as 'an opening pattern available minimum incidence angle' (θ_OP) and 'an opening pattern available maximum incidence angle', respectively. The collects of points at which the extension lines connecting the edges of the opening pattern (OP) and the edges of the light-receiving device (PD) meet the upper surface of the transparent cover 102 draw a closed curve. In this case, an area inside of the closed curve that has the greatest area is defined as 'an effective light-receiving area (ARA)'.

For example, when a portion of the internal light proceeding at an angle greater than the critical angle is used as the signal light, the minimum available angle of incidence of the light shield pattern (θ_LS) may be set to be sufficiently greater than the critical angle and the opening pattern available minimum incidence angle (θ_OP) may be set to be greater than or the same as the critical angle. When such a structure is used, 'the external light proceeding at the critical angle or less' and 'the light that does not contribute to the sensing, of the internal light proceeding with the critical angle or more, are shielded by the light shield pattern LS, thereby minimizing reaching the light-receiving device (PD). On the other hand, among the light proceeding at the critical angle or higher, the light contributing to the sensing reaches the light-receiving device (PD) through the opening pattern (OP), thereby improving the signal to noise ratio.

As another example, the arrangement of the opening pattern (OP) in each light shield pattern (LS) may be set so that the critical angle is between 'the opening pattern available minimum incidence angle' and 'the opening pattern available maximum incidence angle' as necessary. When the light emitted from any luminescence device reaches any light-receiving device (PD), the amount of light reaching the light-receiving device (PD) becomes maximum when the incident angle of the light is close to the critical angle, and the amount of light incident on the light-receiving device may be maximized by setting a suitable structure.

As another example, when a portion of the internal light proceeding at an angle less than the critical angle is used as the signal light, a structure in which the opening pattern minimum available incidence angle is less than the critical angle may be set. When such a structure is set, the ratio of the internal light proceeding with the critical angle or more may be increased compared to the internal light proceeding with an angle less than the critical angle.

The thin-film transistor array 110 includes a driving transistor (DT) that connects to the electro-luminescence device (ELD) corresponding to each display pixel area (DP in FIG. 1).

For instance, the driving transistor (DT) may have a top gate structure. That is, the driving transistor (DT) includes an active layer (ACT) that is disposed above the substrate 101, a gate insulating film 111 that is disposed above a part of the active layer (ACT), a gate electrode (GE) that is disposed above the gate insulating film 111, and a source electrode (SE) and a drain electrode (DE) that are disposed above an interlayer insulating film 112 covering the active layer (ACT) and the gate electrode (GE).

The gate electrode (GE) connects to a switching transistor (ST in FIG. 2) and a storage capacitor (Cst in FIG. 2) through a first node (n1 in FIG. 2).

The active layer (ACT) includes a channel area that is overlapped with the gate electrode (GE), and a source area and a drain area that are disposed on both sides of the channel area. The active layer (ACT) may be made of an oxide semiconductor material or a silicon semiconductor material.

The source electrode (SE) connects to the source area of the active layer (ACT) through a contact hole that penetrates the interlayer insulating film 112.

Like the source electrode (SE), the drain electrode (DE) connects to the drain area of the active layer (ACT) through a contact hole that penetrates the interlayer insulating film 112.

Any one (source electrode (SE) shown in FIG. 6) of the source electrode (SE) and the drain electrode (DE) of the driving transistor (DT) connects to a first driving power supply line (EVDD shown in FIG. 2), and the other (drain electrode (DE) in FIG. 6) connects to the electro-luminescence device (ELD).

The source electrode (SE) and the drain electrode (DE) of the driving transistor (DT) are covered with a buffer film 113.

The electro-luminescence device (ELD) includes an anode electrode (AE_ELD) that is disposed above the buffer film 113 of the thin-film transistor array 110, an electro-luminescence layer (EL) that is disposed above the anode electrode (AE_ELD), and a cathode electrode (CE_ELD) that is disposed above the electro-luminescence layer (EL).

The anode electrode (AE_ELD) corresponds to each display pixel area (DP) and electrically connects to the driving transistor (DT) through the contact hole that penetrates the buffer film 113.

An edge of the anode electrode (AE_ELD) is covered with a bank (BK) that is disposed above the buffer film 113 of the thin-film transistor array 110.

The bank BK that covers the edge of the anode electrode AE_ELD may be made of an insulating material.

The electro-luminescence layer (EL) corresponds to each display pixel area (DP) and is made of an electro-luminescence material. The electro-luminescence material may be an organic material, or an inorganic material. When the diode is made of an organic material, the diode may be referred to as an organic light-emitting diode (OLED). When the diode is made of an inorganic material, the diode may be a quantum-dot light-emitting diode (QLED). However, the diode is not limited to what has been described.

Figure 12:
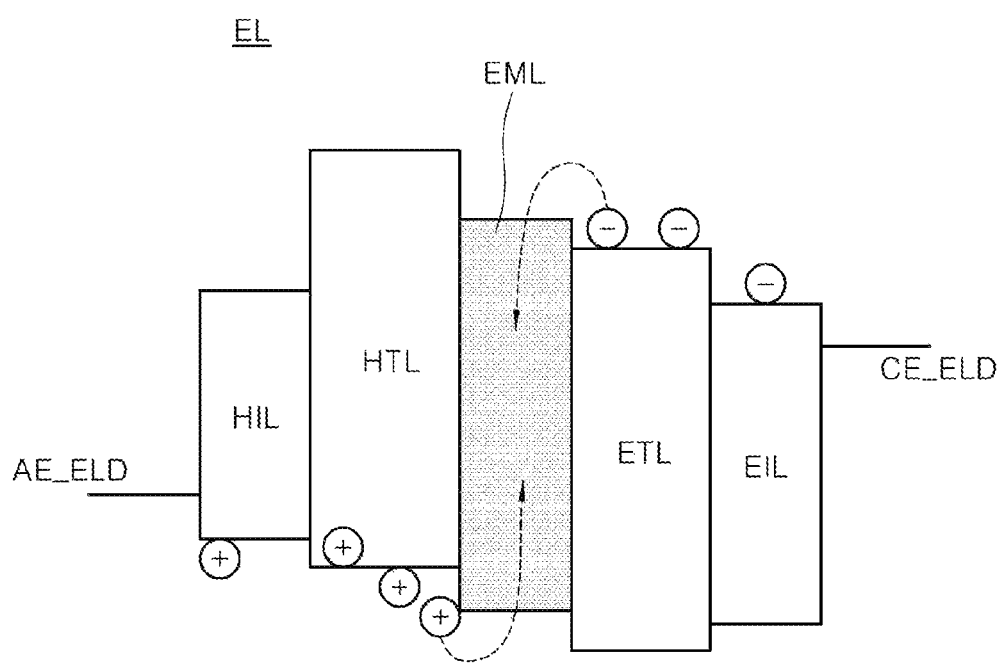
FIG. 12 shows an energy band diagram of an electro-luminescence device in FIG. 11.

As illustrated in FIG. 12, the electro-luminescence layer (EL) may have a structure in which a hole transport layer (HTL), an emitting layer (EML) and an electron transport Layer (ETL) are sequentially stacked. Additionally, the electro-luminescence layer (EL) may have a single-stack light-emitting structure or a multi-stack light-emitting structure.

The hole transport layer (HTL) is disposed near the anode electrode (AE_ELD), and the electron transport Layer (ETL) is disposed near the cathode electrode (CE_ELD). Additionally, the electro-luminescence layer (EL) may further include a hole injection layer (HIL) that is disposed between the hole transport layer (HTL) and the anode electrode (AE_ELD), or an electron injection layer (EIL) that is disposed between the electron transport layer (ETL) and the cathode electrode (CE_ELD). However, the electro-luminescence layer (EL) is not limited what has been described.

The EML of the electro-luminescence layer (EL) includes a dopant or a host of a color corresponding to each display pixel area (DP). Accordingly, the electro-luminescence layer (EL) may emit light of a specific color. When the display panel 11 includes an additional color filter or an optical wavelength conversion layer, the electro-luminescence layer (EL) may emit white light.

The cathode electrode (CE_ELD) corresponds to a plurality of display pixel areas (DP) that are adjacent to each other, and may be disposed to cover the bank (BK) and the electro-luminescence layer (EL).

A light-receiving device (PD) includes an anode electrode (AE_PD) that is disposed above a buffer film 113 of a thin-film transistor array 110, a PIN junction layer (PIN) that is disposed above the anode electrode (AE_PD), and a cathode electrode (CE_PD) that is disposed above the PIN junction layer (PIN).

In the light-receiving device (PD), the anode electrode (AE_PD) connects to a readout line (ROL), and the cathode electrode (CE_PD) electrically connects to a bias power supply (Vbias shown in FIG. 3).

The readout line (ROL) may be disposed in the thin-film transistor array 110. That is, the readout line (ROL) together with the source electrode (SE) and the drain electrode (DE) may be disposed above the interlayer insulating film 112 and may be covered with the buffer film 113. In this case, the anode electrode (AE_PD) of the light-receiving device (PD) may electrically connect to the readout line (ROL) through a contact hole that penetrates the buffer film 113.

Though not additionally illustrated, the readout line (ROL) together with the anode electrode (AE_PD) may also be disposed above the buffer film 113.

Further, though not additionally illustrated, the readout line (ROL) may be disposed above an insulation film between the interlayer insulating film 112 and the buffer film 113.

A connection line between the bias power supply (Vbias) and the cathode electrode (CE_PD) may be disposed in the same layer as any one of the cathode electrode (CE_PD) and the readout line (ROL).

At least part of the light-receiving device (PD) is covered with the bank (BK).

Specifically, at least one display pixel area (DP) may be disposed between a plurality of light-receiving pixel areas (RP), and each light-receiving pixel area (RP) is disposed between two adjacent display pixel areas (DP). That is, each light-receiving device (PD) is disposed between two adjacent display pixel areas (DP). Accordingly, the bank (BK) that covers the edge of the anode electrode (AE_ELD) of the electro-luminescence device (ELD) is disposed to cover the light-receiving device (PD) further.

A transparent encapsulating unit 121 is disposed above the cathode electrode (CE_ELD) of the electro-luminescence device (ELD) and covers the plurality of electro-luminescence devices (ELD) and the plurality of light-receiving devices (PD). Additionally, the transparent encapsulating unit 121 may have a flat shape.

The transparent encapsulating unit 121 may be made of a transparent material to minimize loss of light that is emitted from the electro-luminescence device (ELD) to a transparent cover 102 and to minimize loss of light that is input from the transparent cover 102 to the light-receiving device (PD). Additionally, the transparent encapsulating unit 121 may be made of a transparent insulation material.

The transparent encapsulating unit 121 may include a material having a flattening property. Additionally, the transparent encapsulating unit 121 may include at least one layer made of inorganic material to prevent oxygen and/or moisture from infiltrating the plurality of electro-luminescence devices (ELD). However, the present disclosure is not limited to what has been described.

A plurality of light shield patterns (LS) are disposed above the transparent encapsulating unit 121 and individually overlapped with the plurality of light-receiving devices (PD) that correspond to the plurality of light-receiving pixel areas (RP).

Each light shield pattern (LS) has a width greater than that of each light-receiving device (PD). That is, each light shield pattern (LS) may include a protruding area PA that is arranged at the edge of each light shield pattern (LS) and protruding than the edge of each light-receiving device (PD).

An opening pattern (OP) is disposed at a portion of each light shield pattern (LS).

The transparent cover 102 is disposed above the plurality of light shield patterns (LS). For example, the transparent cover 102 may be disposed above an insulating layer 122. That is, the insulating layer 122 may be disposed between the transparent cover 102 and the plurality of light shield patterns (LS). In this case, the plurality of light shield patterns (LS) is covered with the insulating layer 122. The insulating layer 122 may have a flat surface shape that corresponds to curvature of the pattern of a lower end thereof, or a flat shape.

Next, another aspect of the present disclosure is described with reference to FIGS. 7 to 23.

Figure 7:
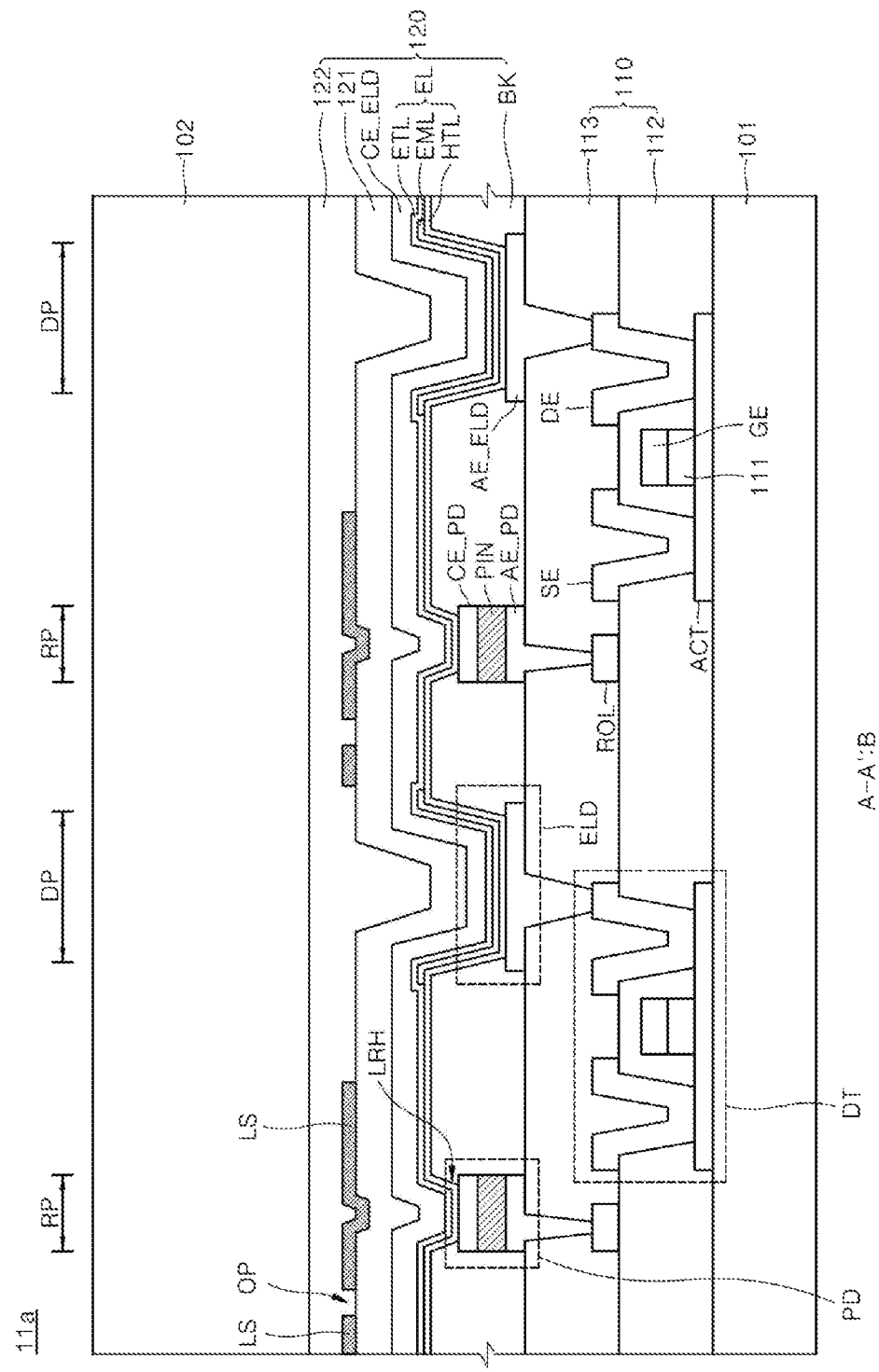
FIG. 7 shows area B in FIG. 5 according to a second aspect of the present disclosure.

FIG. 7 shows area B in FIG. 5 according to a second aspect.

As illustrated in FIG. 7, a display panel 11a of a display apparatus according to the second aspect is the same as that according to the first aspect, illustrated in FIGS. 1 to 6, except that the display panel 11a further includes a light-receiving hole (LRH) that corresponds to each light-receiving device (PD) and that penetrates the bank (BK). Accordingly, repetitive description is avoided.

The light-receiving hole (LRH) corresponds to at least part of a light-receiving surface of each light-receiving device (PD), onto which light is input, (an upper surface of the cathode electrode (CE_PD) of the light-receiving device in FIG. 7).

The light-receiving surface of the light-receiving device (PD) contacts the cathode electrode of the electro-luminescence device (CE_ELD) by the light-receiving hole (LRH).

Accordingly, in a path in which light reflecting from an upper surface of the transparent cover 102 is input to the light-receiving device (PD), an interface between the cathode electrode (CE_ELD) and the bank (BK) may be removed. Thus, loss of light that reflects from the upper surface of the transparent cover 102 and that is input to the light-receiving device (PD) may be prevented caused by the interface between the cathode electrode (CE_ELD) and the bank BK.

According to the first aspect, the light-receiving device (PD) is covered with the bank (BK), as illustrated in FIG. 6. Accordingly, the bank (BK) is made of a transparent material to minimize loss of light that is input to the light-receiving device (PD).

In contrast, as shown in FIG. 7, according to the second aspect, at least part of the light-receiving surface of the light-receiving device (PD) is not covered with the bank (BK) but is exposed to the cathode electrode (CE_ELD) of the electro-luminescence device by the light-receiving hole (LRH). Therefore, the bank (BK) is not required to be made of a transparent material.

Figure 8:
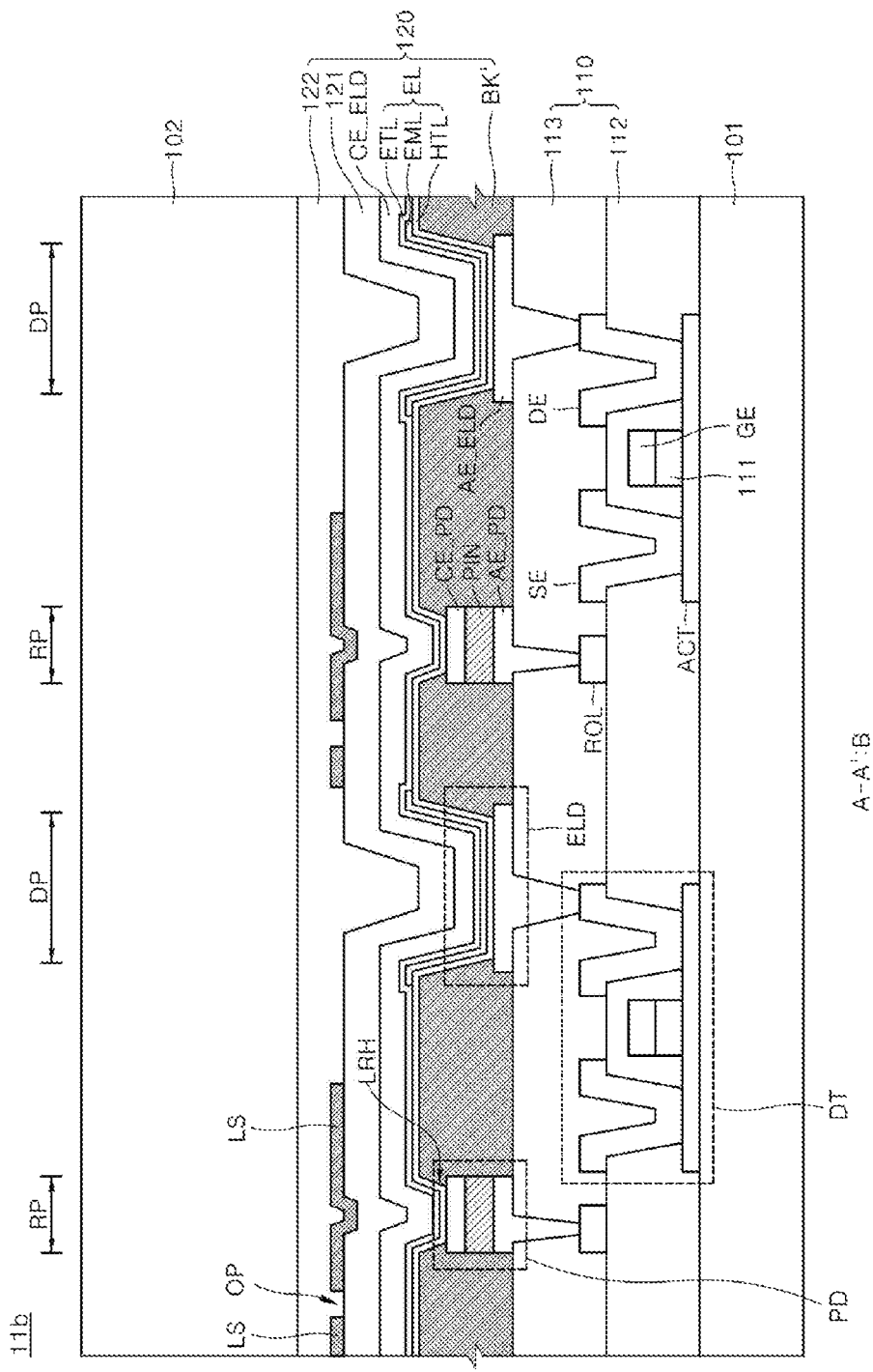
FIG. 8 shows area B in FIG. 5 according to a third aspect of the present disclosure.

FIG. 8 shows area B in FIG. 5 according to a third aspect.

As illustrated in FIG. 8, a display panel 11b of a display apparatus according to the third aspect is the same as that according to the second aspect, illustrated in FIG. 7, except that the display panel 11b includes a bank (BK') that is made of an opaque material instead of a transparent material. Accordingly, repetitive description is avoided.

When the bank (BK') is made of an opaque material, i.e., a light-absorbing material, as in the third aspect, interference between light of adjacent electro-luminescence devices (ELD) may be reduced.

By the opaque bank (BK'), light emitted from the electro-luminescence device (ELD) adjacent to the light-receiving device (PD) may be prevented from being directly input the light-receiving device (PD) in a state in which the light does not reflect from the upper surface of the transparent cover 102.

Accordingly, a reduction in a signal-to-noise ratio (SNR), which is caused by light of adjacent electro-luminescence devices (ELD) may be minimized. Thus, credibility of detection signals of the light-receiving device (PD) may improve further. Additionally, when necessary, a part of the light-receiving device (PD) is covered with the opaque bank (BK'). Accordingly, the size and shape of the effective light-receiving area of the light-receiving device may be readily modified.

Meanwhile, according to the first, second, and third aspects of the present disclosure, the light reflected from the effective light-receiving area (ARA in FIG. 6) in the upper surface of the transparent cover 102 (Light_12 of FIG. 6) is input to the light-receiving device (PD) due to the light shield pattern (LS).

Additionally, when the electro-luminescence layer (EL) and the cathode electrode (CE_ELD) are disposed in the entire display area, the electro-luminescence layer (EL) and the cathode electrode (CE_ELD) of the electro-luminescence device (ELD) are disposed above the light-receiving device (PD). When the cathode electrode (CE_ELD) of the electro-luminescence device (ELD) is made of a semi-transmitting metallic material, an amount of light that is reflected by the cathode electrode (CE_ELD) of the electro-luminescence device (ELD), among light that is input to the light-receiving device (PD), may increase.

Accordingly, a display apparatus according to a fourth aspect is provided which further includes a received light-improving pattern to suppress reflection of light from a plane of incidence of the light-receiving device (PD), that is, a light-receiving area.

Figure 9:
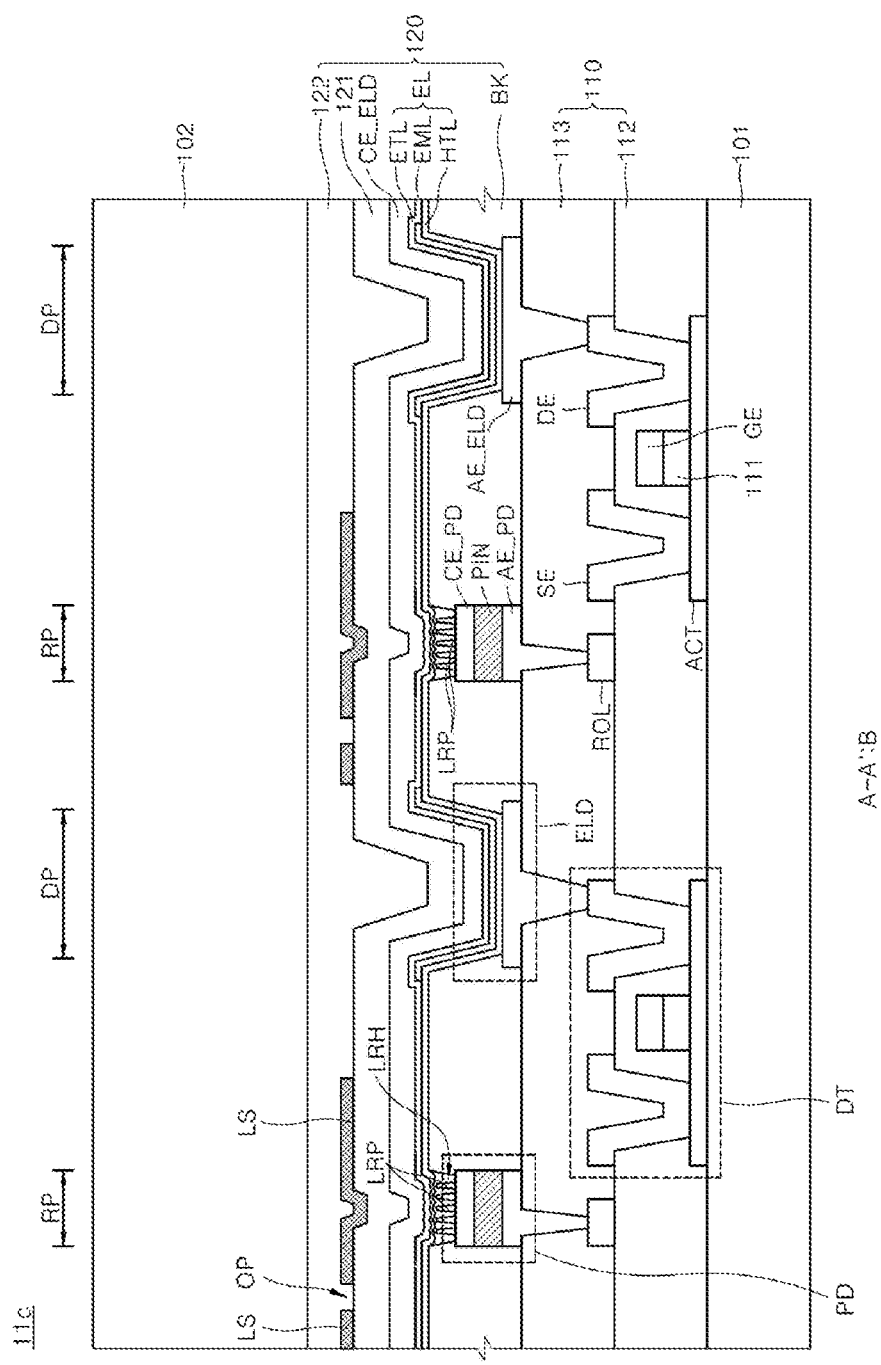
FIG. 9 shows area B in FIG. 5 according to a fourth aspect of the present disclosure.

FIG. 9 shows area B in FIG. 5 according to a fourth aspect.

As illustrated in FIG. 9, a display panel 11c of a display apparatus according to the fourth aspect is the same as that the display panel according to the third aspect, except that the display panel 11c further includes at least one received light-improving pattern (LRP) that is disposed above a part of the light-receiving device (PD), which corresponds to a light-receiving hole (LRH). Accordingly, repetitive description is avoided.

At least one received light-improving pattern (LRP) is disposed above at least part of the light-receiving device (PD).

At least one received light-improving pattern (LRP) may be formed together with the light-receiving hole (LRH) during the process in which the bank (BK) is patterned to form the light-receiving hole (LRH). In this case, at least one received light-improving pattern (LRP) may be made of the same material as the bank (BK). However, this is only an example. The present disclosure is not limited to what has been described.

Each received light-improving pattern (LRP) may have the shape of a polyprism or a cylinder. However, the shape of the received light-improving pattern (LRP) is not limited. Additionally, one or more received light-improving patterns (LRP) are spaced apart from each other.

As described above, when one or more received light-improving patterns (LRP) are included, light that is input to the light-receiving device (PD) may be scattered or diffusely reflected in a spaced area between one or more received light-improving patterns (LRP). The thickness of the cathode electrode (ELD_CE) may become less on a lateral surface of the received light-improving pattern (LRP). Accordingly, a rate at which light is input to the light-receiving device (PD) may increase. Thus, a rate which the light-receiving device (PD) absorbs light may increase, and as a result, photoelectric conversion efficiency of the light-receiving device (PD) may be enhanced.

The at least one received light-improving pattern (LRP) may be formed together with the light-receiving hole (LRH) during a process of patterning the bank (BK) to form the light-receiving hole (LRH). In this case, at least one received light-improving pattern (LRP) may be made of the same material as the bank (BK), and an additional lamination process or an additional patterning process is not required for forming at least one received light-improving pattern (LRP). Accordingly, even though at least one received light-improving pattern (LRP) is further provided, a manufacturing process does not become complicated.

According to the first, second, third and fourth aspects, the plurality of electro-luminescence devices (ELD) that correspond to the plurality of display pixel areas (DP) emit predetermined light. The light-receiving device (PD) senses light that reflects from the upper surface of the transparent cover 102, which is incident through the opening pattern (OP) of the light shield pattern (LS).

A supplementary light source for sensing may be required because the amount of the light emitted from at least one of the plurality of electro-luminescence devices (ELD) is insufficient for being sensed by the light-receiving device (PD) or for other reasons. Accordingly, a display apparatus according to sixth, seventh, and eighth aspect is provided which further includes an additional supplementary light source for sensing a touch or for sensing a fingerprint in addition to the plurality of electro-luminescence devices (ELD) for displaying an image.

Figure 10:
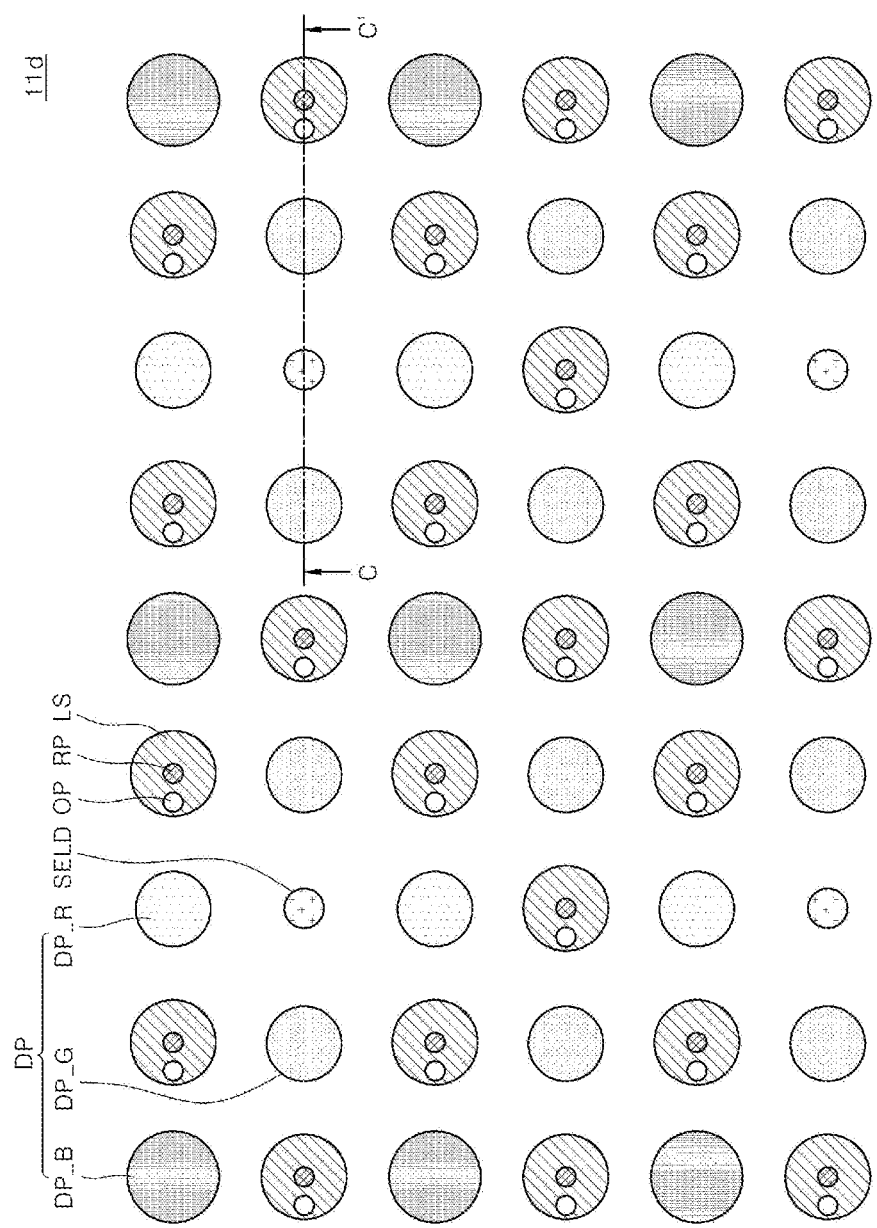
FIG. 10 shows a form in which a plurality of display pixel areas, a plurality of light-receiving pixel areas, a plurality of light shield patterns and a plurality of opening patterns are disposed in a display area of FIG. 1, according to a fifth aspect of the present disclosure.
Figure 11:
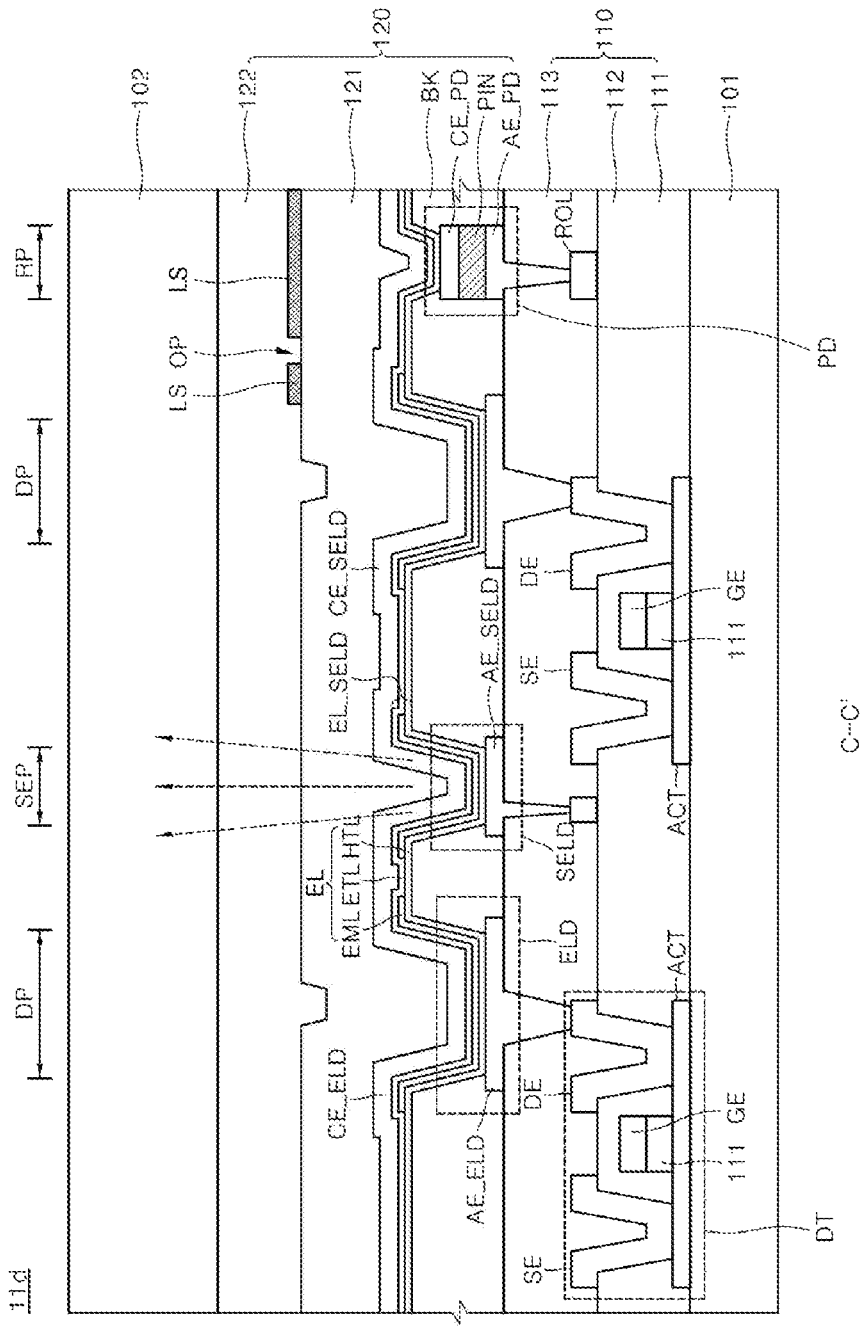
FIG. 11 shows a cross-sectional view of a display panel, which corresponds to area C-C' in FIG. 10.
Figure 13:
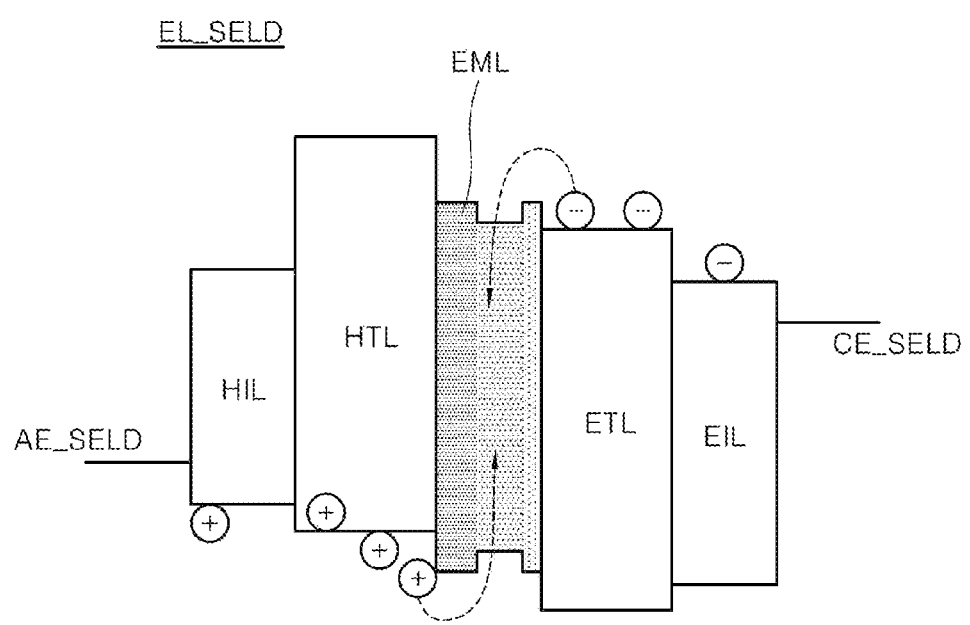
FIG. 13 shows an energy band diagram of a supplementary electro-luminescence device in FIG. 11.

FIG. 10 shows a form in which a plurality of display pixel areas, a plurality of light-receiving pixel areas, a plurality of light shield patterns, and opening patterns are arranged in the display area in FIG. 1 according to the fifth aspect of the present disclosure. FIG. 11 shows an example of a cross-sectional view of a display panel, which corresponds to area C-C' in FIG. 10. FIG. 12 shows an example of an energy band diagram of the electro-luminescence device in FIG. 11. FIG. 13 shows an example of an energy band diagram of a supplementary electro-luminescence device in FIG. 11.

Figure 14:
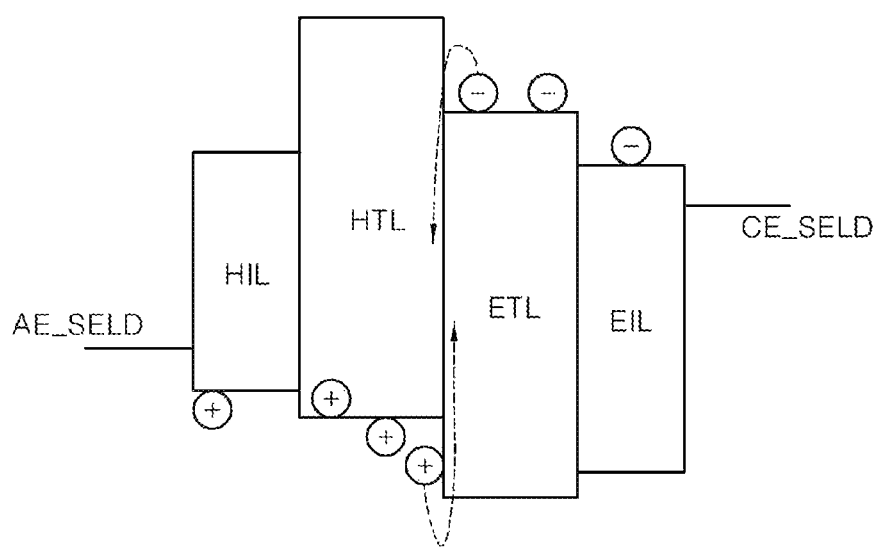
FIG. 14 shows an energy band diagram of a supplementary electro-luminescence device in FIG. 11 according to a sixth aspect of the present disclosure.
Figure 15:
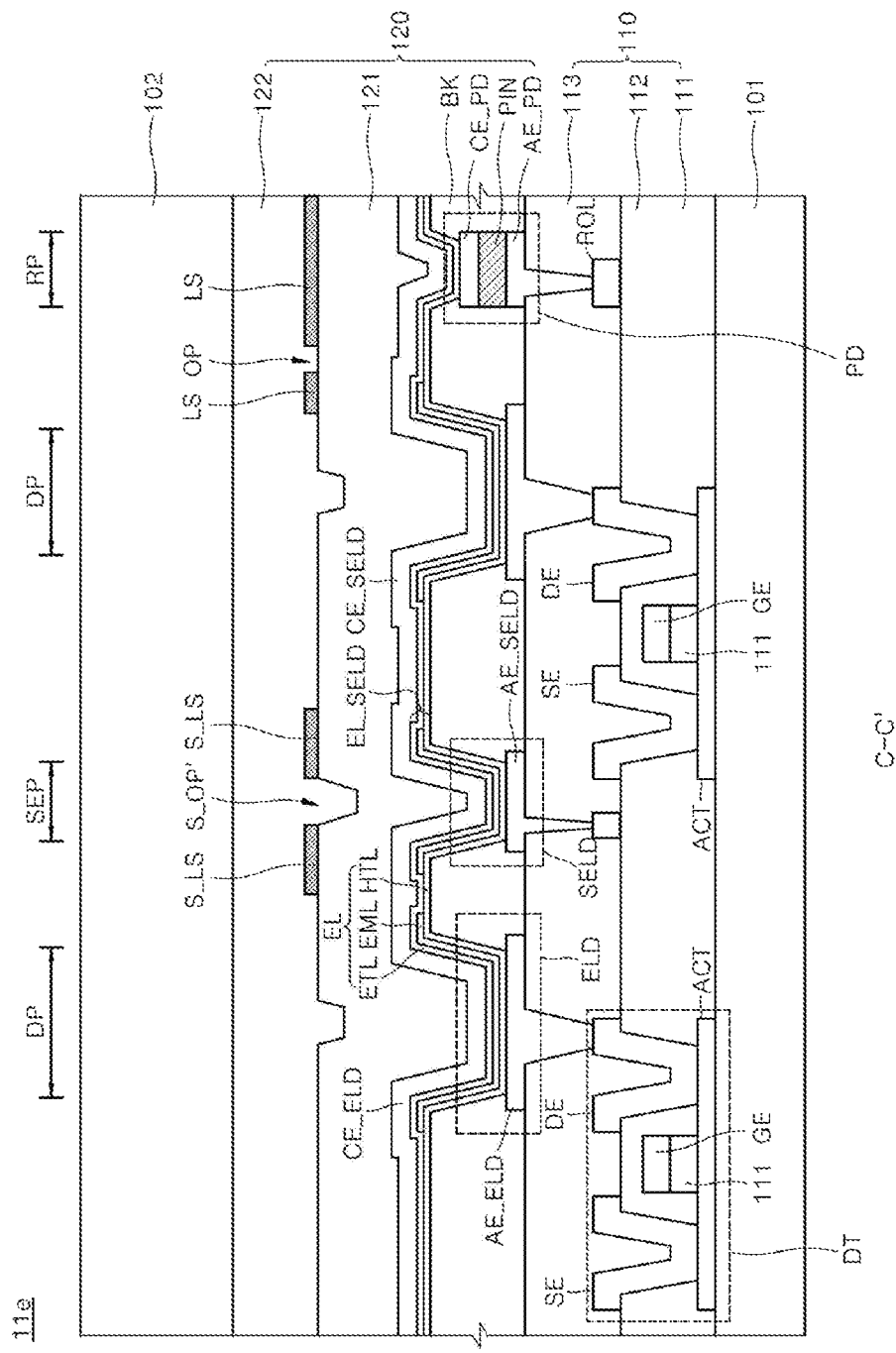
FIG. 15 shows a cross-sectional view of a display panel, which corresponds to area C-C' in FIG. 10 according to a seventh aspect of the present disclosure.

FIG. 14 shows an example energy band diagram with respect to a supplementary electro-luminescence device of FIG. 11 according to a sixth aspect of the present disclosure. FIG. 15 shows an example of a cross-sectional view of a display panel corresponding to area C-C' in FIG. 10 according to a seventh aspect of the present disclosure.

Figure 16:
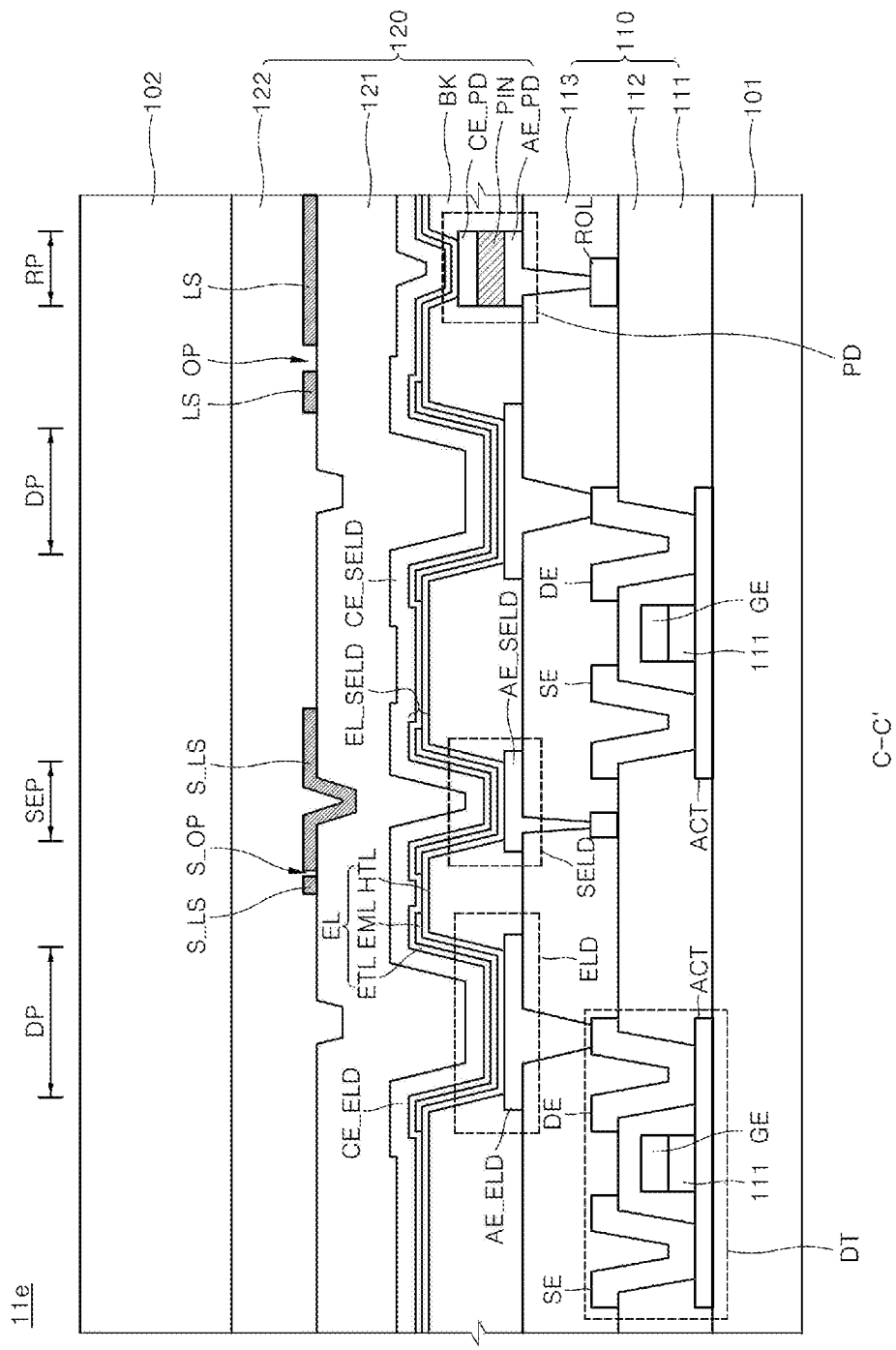
FIG. 16 shows an aspect of a supplementary opening pattern of FIG. 15.

FIG. 16 shows another example of a supplementary opening pattern of FIG. 15.

Figure 17:
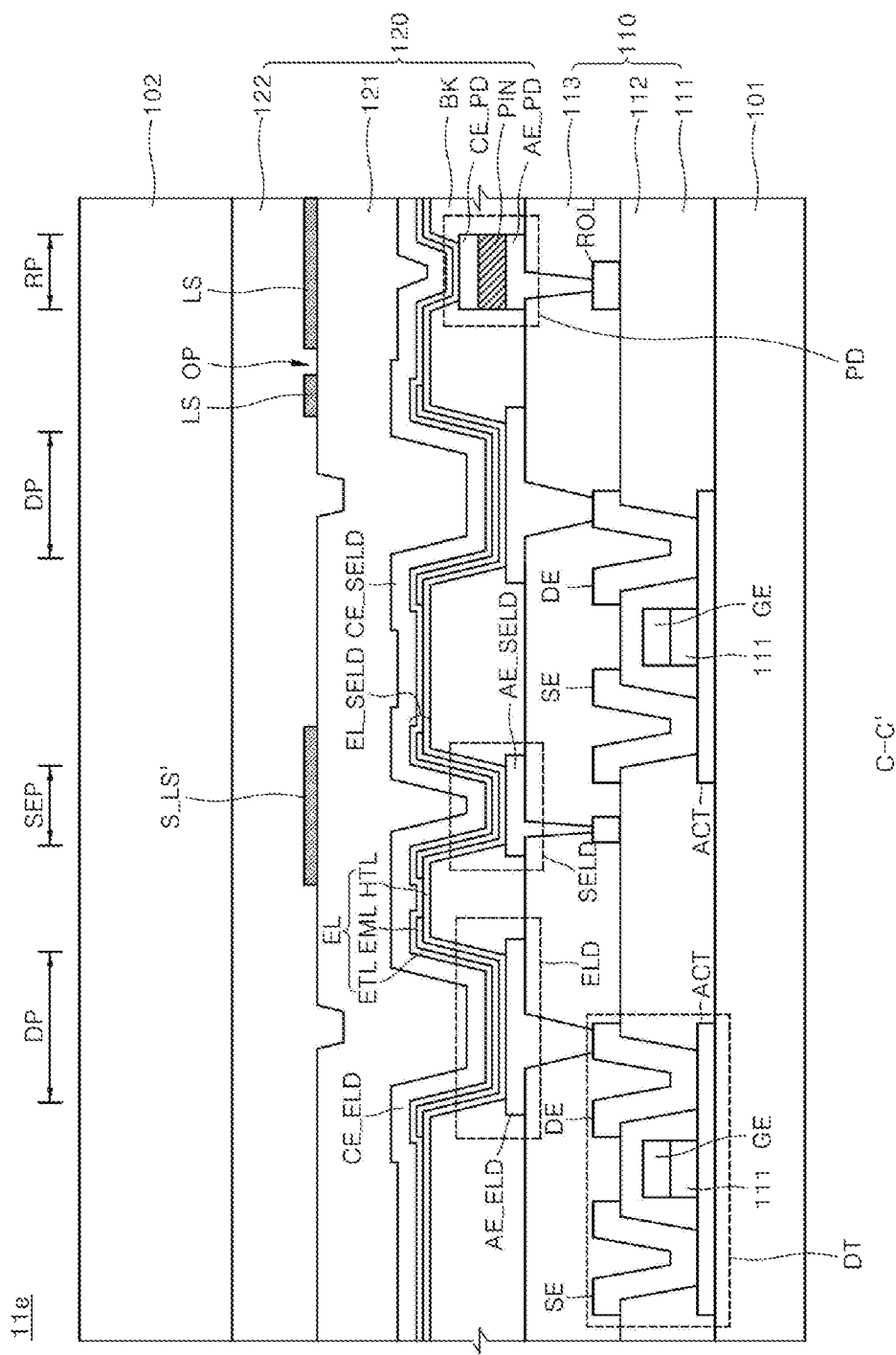
FIG. 17 shows another aspect of a supplementary light shield pattern of FIG. 15.

FIG. 17 shows yet another example of a supplementary light shield pattern of FIG. 15.

Figure 18:
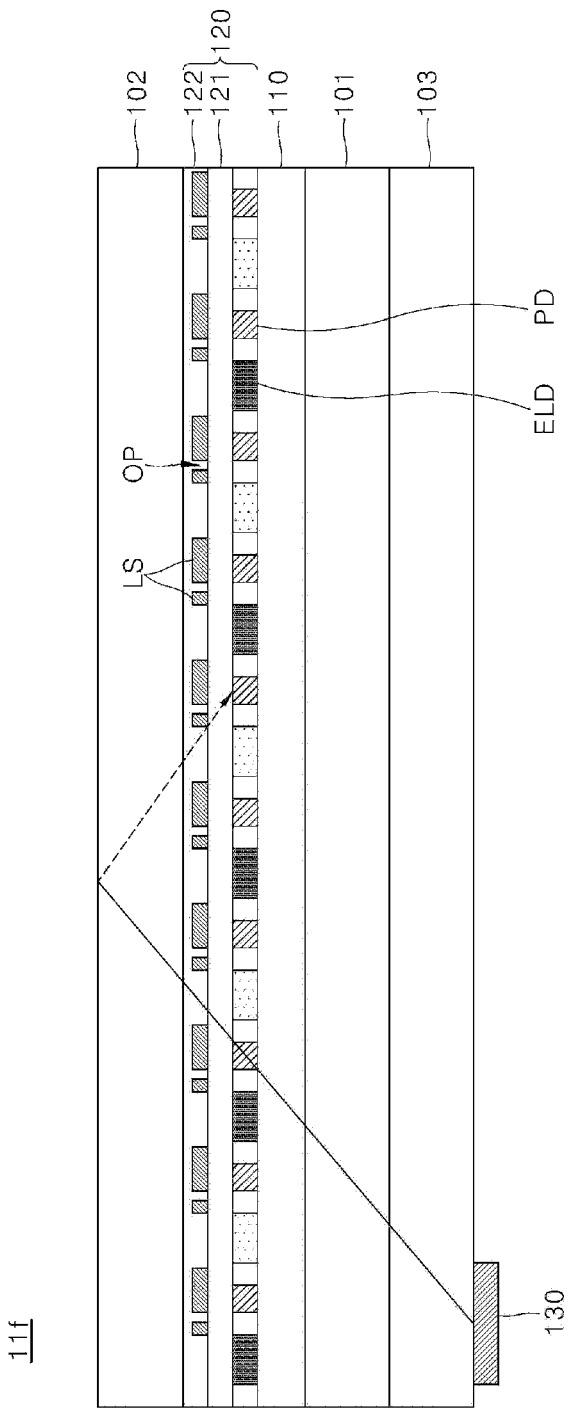
FIG. 18 shows a cross-sectional view of a display panel, which corresponds to area A-A' in FIG. 4 according to an eighth aspect of the present disclosure.

FIG. 18 shows an example of a cross-sectional view of a display panel corresponding to the area A-A' in FIG. 4 according to an eighth aspect of the present disclosure.

As illustrated in FIG. 10, a display panel 11d of the display apparatus according to the fifth aspect further includes at least one supplementary pixel area (SEP) that is arranged in a matrix form together with a plurality of display pixel areas (DP) and a plurality of light-receiving pixel areas (RP) in a display area.

Like the light-receiving pixel area (RP), each supplementary pixel area (SEP) may be disposed between two adjacent display pixel areas (DP).

Additionally, one or more supplementary pixel areas (SEP) may be disposed to alternate with one or more light-receiving pixel areas (RP) that are arranged in parallel in any one direction among the plurality of light-receiving pixel areas (RP).

As illustrated in FIG. 11, a display panel 11d of a display apparatus according to the fifth aspect is substantially the same as that according to the first, second, third and fourth aspects except that the display panel 11d further includes at least one supplementary electro-luminescence device (SELD) that corresponds to at least one supplementary pixel area (SEP). Accordingly, repetitive description is avoided.

At least one supplementary electro-luminescence device (SELD) is disposed in the same layer as a plurality of electro-luminescence devices (ELD) in an in-cell manner. That is, at least one supplementary electro-luminescence device (SELD) is disposed above a thin-film transistor array 110.

Specifically, each supplementary electro-luminescence device (SELD) includes a supplementary anode electrode (AE_SELD) that is disposed above a buffer film 113 of the thin-film transistor array 110, a supplementary electro-luminescence layer (EL_SELD) that is disposed above the supplementary anode electrode (AE_SELD), and a supplementary cathode electrode (CE_SELD) that is disposed above the supplementary electro-luminescence layer (EL_SELD).

A bank (BK) further covers an edge of the supplementary anode electrode (AE_SELD) together with an edge of an anode electrode of an electro-luminescence device (AE_ELD).

The supplementary electro-luminescence layer (EL_SELD) may be made of an organic material like an electro-luminescence layer (EL) of the electro-luminescence device (ELD).

Like the electro-luminescence layer EL of the electro-luminescence device (ELD), the supplementary electro-luminescence layer EL_SELD may include a structure in which an HTL, an EML and an ETL are stacked.

Further, like the electro-luminescence layer EL of the electro-luminescence device (ELD), the supplementary electro-luminescence layer EL_SELD may have a single-stack emitting structure or a multi-stack emitting structure.

As illustrated in FIG. 12, the electro-luminescence layer (EL) of the electro-luminescence device (ELD) may have a structure in which a hole injection layer (HIL), a hole transport layer (HTL), an emitting layer (EML), an electron transport layer (ETL), and an electron injection layer (EIL) are stacked.

A hole that is injected from an anode electrode (AE_ELD) of an electro-luminescence device (ELD) into the hole injection layer (HIL) moves to the emitting layer (EML) through the hole transport layer (HTL), and an electron that is injected from a cathode electrode (CE_ELD) of the electro-luminescence device (ELD) into the electron injection layer (EIL) moves to the emitting layer (EML) through the electron injection layer (EIL). Accordingly, as the hole and the electron are moved to the EML, the electron-hole pair is generated. As the electron-hole pair returns to a ground state, light is emitted.

The emitting layer (EML) may include a dopant or a host that corresponds to a color which is required to be emitted from each display pixel area (DP). That is, an EML of an electro-luminescence layer (EL) of an electro-luminescence device (ELD) corresponding to a red display pixel area (DP_R) may include a dopant or a host that corresponds to a red color, an EML of an electro-luminescence layer (EL) of an electro-luminescence device (ELD) corresponding to a green display pixel area (DP_G) may include a dopant or a host that corresponds to a green color, and an EML of an electro-luminescence layer (EL) of an electro-luminescence device (ELD) corresponding to a blue display pixel area (DP_B) may include a dopant or a host that corresponds to a blue color.

When a display panel includes an additional color filter, the EML may include a dopant or a host that corresponds to at least two different colors and may emit white light.

The supplementary electro-luminescence layer (EL_SELD) of the supplementary electro-luminescence device (SELD) is formed through the same process as the process of forming the electro-luminescence layer (EL) of the electro-luminescence device (ELD). Accordingly, the supplementary electro-luminescence layer (EL_SELD) of the supplementary electro-luminescence device (SELD) may have the same structure as the electro-luminescence layer (EL) of the electro-luminescence device (ELD).

That is, the supplementary electro-luminescence layer (EL_SELD) of the supplementary electro-luminescence device (SELD), as illustrated in FIG. 15, may have a structure in which a hole injection layer (HIL), a hole transport layer (HTL), an emitting layer (EML), an electron transport layer (ETL), and an electron injection layer (EIL) are stacked.

The supplementary electro-luminescence layer (EL_SELD) of the supplementary electro-luminescence device (SELD) may include a dopant or a host that corresponds to at least any one of red, green and blue. That is, the supplementary electro-luminescence layer (EL_SELD) may include a dopant or a host that corresponds to any one of red, green and blue. For example, the supplementary electro-luminescence layer (EL_SELD) may include a dopant or a host of the same color as the electro-luminescence device (ELD) adjacent to the supplementary electro-luminescence device (SELD).

The supplementary electro-luminescence layer (EL_SELD) may also include all dopants or all hosts that correspond to red, green and blue.

As described above, a display panel 11*d* of a display apparatus according to the fifth aspect further includes at least one supplementary electro-luminescence device (SELD) for increasing an amount of light that is input to a light-receiving device (PD), in addition to a plurality of electro-luminescence devices (ELD).

An amount of light that is input from a device array 120 to a transparent cover 102, that is, an amount of light generated from inside of the panel 11*d* may be increased by the supplementary electro-luminescence device (SELD). Additionally, when the supplementary electro-luminescence device (SELD) optionally emits light to a predetermined area, an amount of light that reflects from an upper surface of the transparent cover 102 may increase.

Accordingly, the amount of light that is input to the light-receiving device (PD) may be maintained at a certain level or above, regardless of luminance of the electro-luminescence device (ELD). Therefore, credibility of generation of detection signals of each light-receiving device (PD) may improve.

Meanwhile, the light of the supplementary electro-luminescence device (SELD) may be infrared rays (IR) to prevent the light of the supplementary electro-luminescence device (SELD) from being interfered with the light to display the image.

Accordingly, the amount of light that is input to the light-receiving device (PD) may be maintained at a certain level or above, regardless of luminance of the electro-luminescence device (ELD). Therefore, credibility of generation of detection signals of each light-receiving device (PD) may improve.

The supplementary electro-luminescence device (SELD) is disposed in a limited area between adjacent electro-luminescence devices (ELD). Additionally, it is difficult to place a device that emits infrared rays in an area with a narrow width.

Accordingly, a display apparatus according to a sixth aspect is provided which includes a supplementary electro-luminescence device (SELD) that may be disposed in a narrow area and that may emit infrared rays.

FIG. 14 shows an example of an energy band diagram corresponding to a supplementary electro-luminescence device in FIG. 11 according to a sixth aspect.

As illustrated in FIG. 14, a display apparatus according to the sixth aspect is the same as that according to the fifth aspect illustrated in FIGS. 10, 11, 12 and 13 except that a supplementary electro-luminescence layer (EL_SELD') of a supplementary electro-luminescence device (SELD) does not include an emitting layer (EML) unlike the electro-luminescence layer (EL) of the electro-luminescence device (ELD). Accordingly, repetitive description is avoided.

The supplementary electro-luminescence layer (EL_SELD') of the supplementary electro-luminescence device (SELD) according to the sixth aspect does not include an emitting layer (EML). Accordingly, the supplementary electro-luminescence layer (EL_SELD') of the supplementary electro-luminescence device (SELD) has a structure in which a hole transport layer (HTL) and an electron transport layer (ETL) are bonded.

When the emitting layer (EML) that corresponds to a certain color is removed, a change in energy levels may be less than a change in energy levels corresponding to visible light in the interface between the hole transport layer and the electron transport layer. Accordingly, the supplementary electro-luminescence device (SELD) that includes the supplementary electro-luminescence layer (EL_SELD') with a structure in which an emitting layer (EML) is not included and in which a hole transport layer (HTL) and an electron transport layer (ETL) are bonded may emit infrared rays unlike the electro-luminescence device (ELD) that includes an emitting layer (EML) corresponding to visible light.

Thus, the supplementary electro-luminescence device (SELD) that is disposed in an area with a narrow width may be a device that may emit infrared rays.

As shown in FIG. 15, a display panel 11*e* of the display apparatus according to the seventh aspect of the present disclosure is the same as the fifth and sixth aspects shown in FIGS. 10 to 14 except that the display panel 11*e* of the display apparatus further includes at least one supplementary light shield pattern (S_LS) that is overlapped with at least one supplementary electro-luminescence device (SELD) and a supplementary opening pattern (S_OP) that is disposed at a portion of each supplementary light shield pattern (S_LS) and the repetitive description thereof is omitted.

The supplementary light shield pattern (S_LS) is disposed above the transparent encapsulating unit 121. Each supplementary light shield pattern (S_LS) has an area greater than that of each supplementary luminescence element (SELD). That is, each supplementary light shield pattern (S_LS) includes a protruding area PA protruding than each supplementary electro-luminescence device (SELD).

The supplementary opening pattern (S_OP) may be disposed at a portion of the protruding area (PA) of each supplementary light shield pattern (S_LS). There is an advantage that an incidence angle of the light passing through the supplementary opening pattern (S_OP) among the light emitted from the supplementary electro-luminescence device (SELD) with respect to the upper surface of the transparent cover 102 may be specified.

Among lines that connect the edge of each supplementary electro-luminescence device (SELD) and the edge of each supplementary opening pattern (S_OP), the normal line of the upper surface of the transparent cover 102 and a line form a minimum angle. The line is defines as 'supplementary opening pattern available minimum incidence path'. An angle formed by that line and the normal line of the upper surface of the transparent cover 102 may be set as a range of angles similar to an opening pattern available minimum incidence angle (θ_OP) corresponding to each light-receiving device (PD).

By doing so, among light that is emitted from each supplementary electro-luminescence device (SELD), an amount of noise light that may not be input to the light-receiving device (PD) may decrease.

Alternatively, as shown in FIG. 16, each supplementary opening pattern (S_OP) may be at least partially overlapped with each supplementary electro-luminescence device (SELD).

Alternatively, as shown in FIG. 17, each supplementary light shield pattern (S_LS') may have a width similar to that of each supplementary electro-luminescence device (SELD) and may be at least partially overlapped with each supplementary electro-luminescence device (SELD). In this case, the display panel does not include the supplementary opening pattern that is disposed in each supplementary light shield pattern (S_LS').

As illustrated in FIG. 18, a display panel 11f according to the eight aspect is the same as that according to the first, second, third, and fourth aspects except that the display panel 11f further includes a light guide unit 103 that is disposed below a substrate 101 and that has the shape of a flat plate, and a supplementary light source unit 130 that is disposed at one side of a light guide unit 103. Accordingly, repetitive description is avoided below.

The light guide unit 103 guides the light emitted from the supplementary light source unit 130 to an entire display area. The supplementary light source unit 130 includes at least one luminescence device that is disposed at one side of the display area. The supplementary light source unit 130 may include a plurality of luminescence devices that are disposed throughout the display area.

The supplementary light source unit 130 supplies light during a sensing period for which a plurality of light-receiving devices (PD) are driven. The supplementary light source unit 130 is disposed in a different layer from a device array 120 that includes a plurality of electro-luminescence devices (ELD). Accordingly, the supplementary light source unit 130 may readily supply light that has an emission direction and a range of wavelengths different from those of the electro-luminescence device (ELD).

On the other hand, the geometric structure of the opening pattern (OP), the light-receiving device (PD), and the transparent cover 102 may be changed to set the effective light-receiving area to improve accuracy of sensing the touch.

Figure 19:
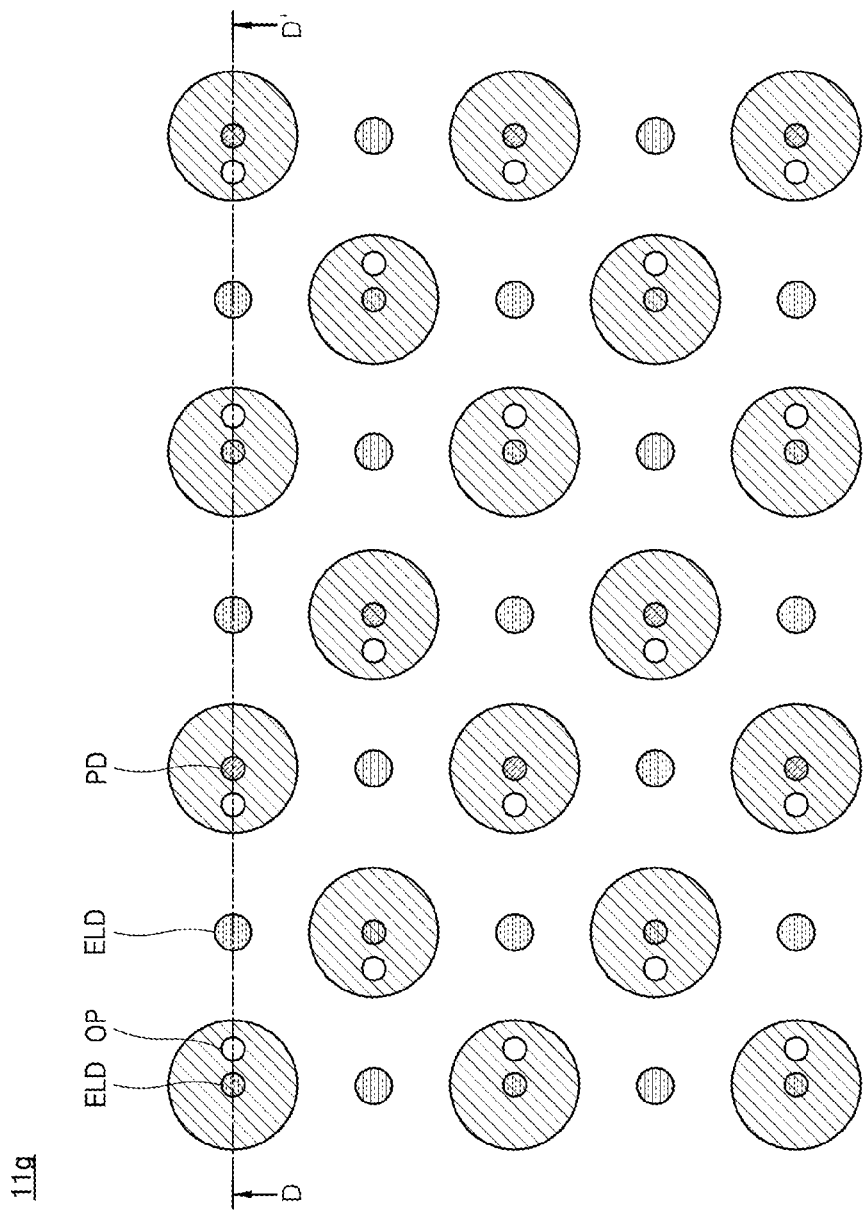
FIG. 19 is a schematic view of an arrangement of a plurality of electro-luminescence devices, a plurality of light-receiving devices, a plurality of light shield patterns and opening patterns according to a ninth aspect of the present disclosure.
Figure 20A:
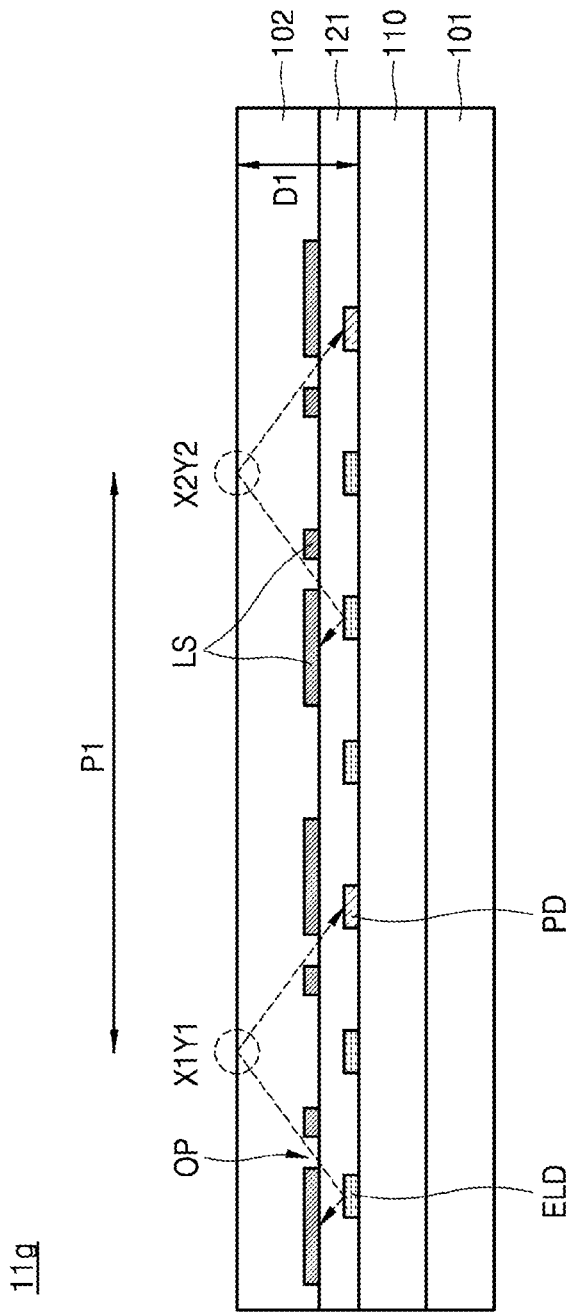
FIG. 20A shows a cross-sectional view of a display panel corresponding to area D-D' in FIG. 19 according to the ninth aspect of the present disclosure.

FIG. 19 is a schematic view of an arrangement of a plurality of electro-luminescence devices, a plurality of light-receiving devices, a plurality of light shield patterns and opening patterns according to a ninth aspect of the present disclosure. FIG. 20A shows a cross-sectional view of a display panel corresponding to area D-D' in FIG. 19 according to the ninth aspect of the present disclosure.

According to the ninth aspect of the present disclosure, in a display panel 11g of the display apparatus, a thin-film transistor array 110 is disposed above a substrate 101. Hereinafter, the repetitive description of the thin-film transistor array 110 is omitted for convenience of explanation.

A plurality of electro-luminescence devices (ELD) is disposed above the thin-film transistor array 110. A portion of the plurality of electro-luminescence devices (ELD) are electro-luminescence devices for sensing that supply light for touch and/or fingerprint sensing, and others thereof may be an electro-luminescence device for display that supplies light for image display. Among the plurality of electro-luminescence devices (ELD), the electro-luminescence device for display may be electrically connected to a plurality of thin-film transistors disposed in the thin-film transistor array 110. Alternatively, the entire plurality of electro-luminescence devices (ELD) may be electrically connected to a plurality of thin-film transistors disposed in the thin-film transistor array 110. The area of each of the plurality of electro-luminescence devices (ELD) may be equal to or different from that of adjacent electro-luminescence device. For example, the area of the electro-luminescence device (ELD) may vary depending on the optical property and brightness property of the electro-luminescence device ELD. For example, when an efficiency of blue light is degraded compared to that of green light, the area of the electro-luminescence device (ELD) that displays the blue light may be greater than the area of the electro-luminescence device (ELD) to display the red light, but is not limited thereto. Hereinafter, the repetitive description of the electro-luminescence device (ELD) is omitted for convenience of explanation. In addition, in the following description, it is assumed that the electro-luminescence device (ELD) is for sensing unless otherwise stated.

FIGS. 19 and 20A show the plurality of electro-luminescence devices (ELD) as the same electro-luminescence devices for convenience of explanation, but the present disclosure is not limited thereto. The plurality of electro-luminescence devices (ELD) may be electro-luminescence devices that output at least one of red light, green light, blue light, white light, or infrared light according to the arrangement thereof. That is, each of the plurality of electro-luminescence devices (ELD) may include a specific electro-luminescence layer EL. Hereinafter, the repetitive description of the electro-luminescence layer EL is omitted for convenience of explanation.

A plurality of light-receiving devices (PD) is disposed above a thin-film transistor array 110. The plurality of light-receiving devices (PD) is spaced apart from the plurality of electro-luminescence devices ELDs. The plurality of light-receiving devices (PD) may be electrically connected to a plurality of thin-film transistors disposed in the thin-film transistor array 110. Hereinafter, the repetitive description of the light-receiving device (PD) is omitted for convenience of explanation.

The plurality of light shield patterns LSs may shield a portion of the plurality of electro-luminescence devices (ELD) and a plurality of light-receiving devices (PD) that are disposed above the thin-film transistor array 110. A portion in which the light is shielded by the light shield pattern (LS) among the plurality of electro-luminescence devices (PD) is the electro-luminescence device for sensing. That is, each light shield pattern (LS) covers at least one electro-luminescence device (ELD) or light-receiving device (PD). Hereinafter, the repetitive description of the light shield pattern (LS) is omitted for convenience of explanation.

A plurality of opening patterns (OP) are formed in the plurality of light shield patterns LSs. Hereinafter, the repetitive description of the opening pattern (OP) is omitted for convenience of explanation.

It is possible to further include other components described in other aspects of the present disclosure between the substrate 101 and the thin-film transistor array 110 disposed above the substrate 101. It is also possible to further include other components described in other aspects of the present disclosure between the thin-film transistor array 110 and the transparent encapsulating unit 121. It is also possible to further include other components described in other aspects of the present disclosure between the transparent encapsulating unit 121 and the transparent cover 102.

The plurality of opening patterns (OP) has the predetermined opening directions. The opening pattern (OP) having the predetermined opening direction will be described below with reference to FIGS. 19 and 20A. The opening direction refers to a specific direction in which the light of the electro-luminescence device (ELD) covered by the light shield pattern (LS) is emitted through the opening pattern (OP), and the opening pattern (OP) may have a position, a size, and a shape corresponding to the predetermined opening direction.

An electro-luminescence device (ELD) is shielded by the light shield pattern (LS). The light shield pattern (LS) available minimum incidence angle may extend from the critical angle. That is, the light emitted from the electro-luminescence device (ELD) may be shielded by the light shield pattern (LS) in all directions, but is not limited thereto. The opening pattern (OP) disposed in the light shield pattern (LS) that covers the electro-luminescence device (ELD) has the predetermined opening direction. Therefore, the light emitted from the electro-luminescence device (ELD) passes through the opening pattern (OP) having the predetermined opening direction. Therefore, the light output from the opening pattern (OP) may have a specific direction and may be totally reflected at a predetermined position (X1Y1). Further, the totally reflected light may be directed to the light-receiving device (PD).

The light-receiving device (PD) corresponding to one electro-luminescence device (ELD) is shielded by the light shield pattern (LS). The light-shield-pattern (LS) available minimum incidence angle may extend from the critical angle. That is, the light incident on the light-receiving device (PD) may be shielded by the light shield pattern (LS) in all directions, but is not limited thereto. The opening pattern (OP) disposed in the light shield pattern (LS) that covers the light-receiving device (PD) has the predetermined opening direction. Therefore, the light that passes through the opening pattern (OP) may be incident on the light-receiving device (PD).

Referring back to FIG. 20A, an electro-luminescence device (ELD) corresponds to a light-receiving device (PD). That is, an electro-luminescence device (ELD) and a light-receiving device (PD) have predetermined optical communication channels. The predetermined light is totally reflected at a predetermined first coordinate (X1Y1). Therefore, it is possible to determine whether the fingerprint is sensed at the first coordinate (X1Y1) based on measurement of amount of light corresponding to the first coordinate (X1Y1) and incident on the light-receiving device.

Referring back to FIG. 20A, another electro-luminescence device (ELD) corresponds to another light-receiving device (PD).

That is, the opening pattern (OP) of the light shield pattern (LS) of one electro-luminescence device (ELD) of the plurality of electro-luminescence devices (ELD) and the opening pattern (OP) of the light shield pattern (LS) of one light-receiving device (PD) of the plurality of light-receiving devices (PD) may correspond to each other in the predetermined opening direction.

That is, another electro-luminescence device (ELD) and another light-receiving device (PD) have the predetermined optical communication channels. The predetermined light may be totally reflected at a predetermined second coordinate (X2Y2). Therefore, it is possible to determine whether the fingerprint is sensed at the second coordinate (X2Y2) based on the measurement of an amount of light that corresponds to the second coordinate (X2Y2) and is incident on the light-receiving device (PD). Resolution required for the fingerprint sensing may be determined based on adjustment of a spaced distance P1 between the first coordinate (X1Y1) and the second coordinate (X2Y2). Therefore, it is possible to determine whether the fingerprint or the touch is sensed at the first coordinate (X1Y1) and the second coordinate (X2Y2). With the above-described principle, information on the coordinates required for sensing the fingerprint may be provided to the display panel 11g.

Information on refractive index of each layer of the display panel 11g, the coordinate of the electro-luminescence device (ELD), the coordinate of the light-receiving device (PD), and information on a distance between the electro-luminescence device (ELD) and the surface of the display panel 11g, and the light-receiving device (PD) and the surface of the display panel 11g, for example, a distance D1 to a transparent cover 102, and the like may be used to set each coordinate. An electro-luminescence device (ELD) and a light-receiving device (PD), which correspond to each other in the predetermined opening direction, may be spaced apart from each other by a predetermined distance.

An electro-luminescence device for display that is not covered by the light shield pattern (LS) may be provided between the electro-luminescence device (ELD) and the light-receiving device (PD) that correspond to each other. Therefore, the display panel 11g may display the image. However, the present disclosure is not limited thereto, and at least one electro-luminescence device may be provided between the electro-luminescence device (ELD) and the light-receiving device (PD) corresponding to each other. However, the present disclosure is not limited thereto, and at least one light-receiving device may be provided between the electro-luminescence device (ELD) and the light-receiving device (PD) corresponding to each other.

Figure 20B:
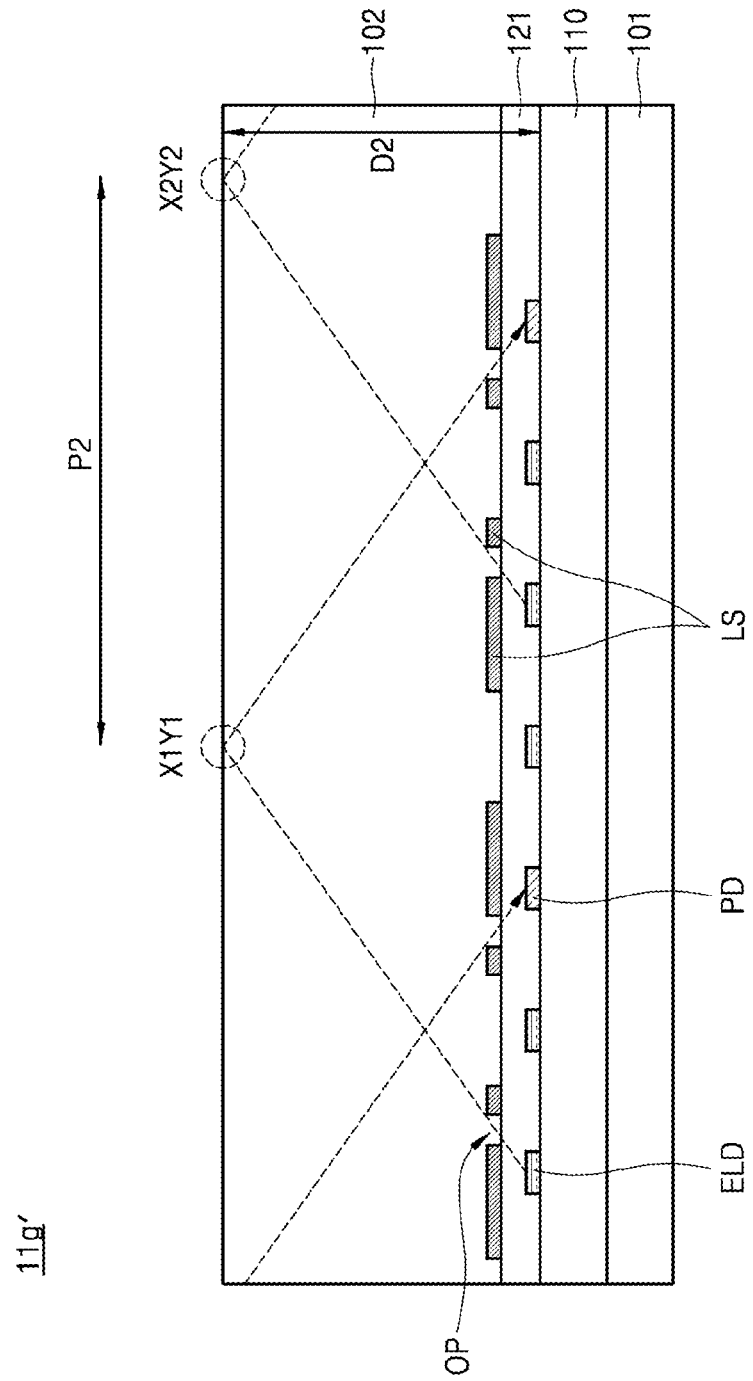
FIG. 20B shows a cross-sectional view of a display panel corresponding to the area D-D' in FIG. 19 according to a tenth aspect of the present disclosure.

FIG. 20B shows a cross-sectional view of a display panel corresponding to area D-D' in FIG. 18 according to a tenth aspect of the present disclosure. A display panel 11g' of the display apparatus according to the tenth aspect of the present disclosure is a modification aspect substantially similar to the ninth aspect of the present disclosure. Hereinafter, the repetitive description thereof is omitted for convenience of explanation.

A plurality of electro-luminescence devices (ELD) is disposed above a thin-film transistor array 110. A plurality of light-receiving devices (PD) is disposed above the thin-film transistor array 110. The plurality of light-receiving devices (PD) is spaced apart from the plurality of electro-luminescence devices (ELD), respectively. A plurality of light shield patterns LSs may shield a portion of the plurality of electro-luminescence devices (ELD) and a plurality of light-receiving devices (PD). A plurality of opening patterns (OP) is formed in the plurality of light shield patterns LSs. The plurality of opening patterns (OP) has a predetermined opening direction.

The display panel 11g' shown in FIG. 20B has a transparent cover 102 that has a thickness greater than that of the display panel 11g shown in FIG. 20A. An electro-luminescence device (ELD) corresponds to a light-receiving device (PD). That is, an electro-luminescence device (ELD) and a light-receiving device (PD) have a predetermined optical communication channel. The predetermined light is totally reflected at a predetermined first coordinate (X1Y1). Therefore, it is possible to determine whether fingerprint is sensed at the first coordinate (X1Y1) based on the measurement of the amount of light that corresponds to the first coordinate (X1Y1) and is incident on the light-receiving device. A path in which the light is totally reflected at the first coordinate (X1Y1) becomes long because the thickness of the transparent cover 102 as shown in FIG. 20B is relatively greater than that of the aspect of FIG. 20A when each coordinate is set. A distance (D2) between the electro-luminescence device (ELD) and the transparent cover 102 is increased. In this case, the electro-luminescence device (ELD) may be difficult to correspond to a nearest light-receiving device (PD).

In this case, at least one electro-luminescence device and/or at least one light-receiving device may be further provided between the electro-luminescence device (ELD) and the light-receiving device (PD) corresponding to each other among the plurality of electro-luminescence devices and the plurality of light-receiving devices. Therefore, the display panel 11g' may display an image.

Even if the distance between the electro-luminescence device (ELD) and the light-receiving device (PD) corresponding to each other increases as the distance (D2) between the electro-luminescence device (ELD) and the transparent cover 102 increases, a spacing distance (P2) between the first coordinate (X1Y1) and the second coordinate (X2Y2) may not substantially increase than the spacing distance (P1) as shown in FIG. 20A. Therefore, even if the display panel 11' is greater, the resolution of sensing the fingerprint may not be substantially reduced.

In more detail, the thickness of the transparent cover may vary depending on a property of the display panel.

For example, when the display panel is a rollable or foldable flexible display panel, the thickness of the transparent cover may need to be as less as possible for flexibility. That is, the display panel is a flexible display panel and the transparent cover 102 may be determined in consideration of the property of the flexible display panel.

For example, when the display panel is a digital signage, the thickness of the transparent cover may have to be sufficiently greater to protect the display panel. However, according to the aspects of the present disclosure, as the display panel is not greatly influenced by the thickness of various types of components, the display panel may be applied to products having various thicknesses.

Figure 21:
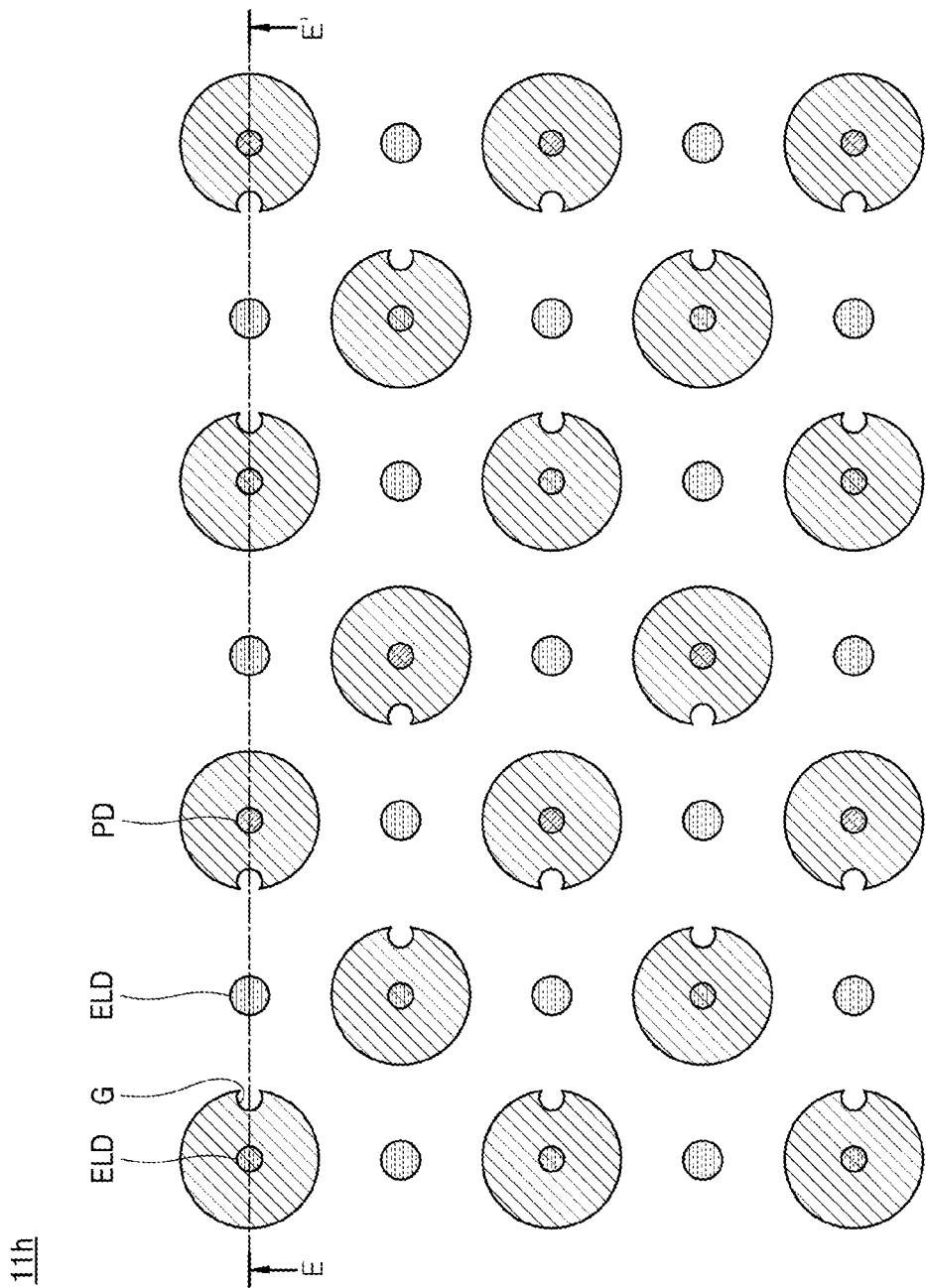
FIG. 21 is a schematic view of an arrangement of a plurality of electro-luminescence devices, a plurality of light-receiving devices, a plurality of light shield patterns and opening patterns according to an eleventh aspect of the present disclosure.

FIG. 21 is a schematic view of an arrangement of a plurality of electro-luminescence devices, a plurality of light-receiving devices, a plurality of light shield patterns and opening patterns according to an eleventh aspect of the present disclosure.

Figure 22:
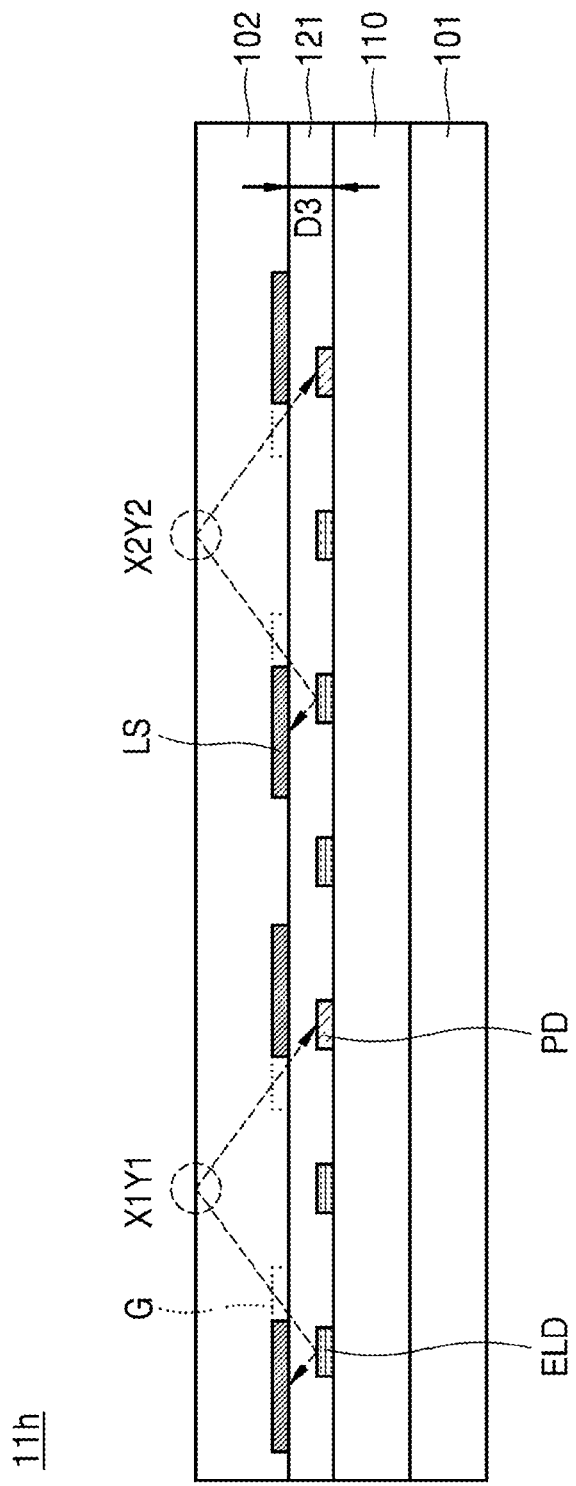
FIG. 22 shows a cross-sectional view of a display panel corresponding to area E-E' in FIG. 21 according to the eleventh aspect of the present disclosure.

FIG. 22 shows an example of a cross-sectional view of a display panel corresponding to area E-E' in FIG. 21 according to the eleventh aspect of the present disclosure.

The eleventh aspect of the present disclosure will be described below with reference to FIGS. 21 and 22. The eleventh aspect of the present disclosure is substantially similar to the ninth aspect of the present disclosure. Hereinafter, for convenience of description, the repetitive description thereof is omitted.

A thin-film transistor array 110 is disposed above a substrate 101 in a display panel 11h of a display apparatus according to the eleventh aspect of the present disclosure. A plurality of electro-luminescence devices (ELD) is disposed above the thin-film transistor array 110. A plurality of light-receiving devices (PD) is disposed above the thin-film transistor array 110. A plurality of light shield patterns LSs may shield a portion of the plurality of electro-luminescence devices (ELD) and a plurality of light-receiving devices (PD).

An area of the light shield pattern (LS) of the plurality of the light shield patterns LSs according to the eleventh aspect of the present disclosure is relatively reduced compared to the plurality of light shield patterns LSs according to the ninth aspect of the present disclosure. The light shield pattern (LS) includes a groove (G) instead of the opening pattern.

Referring back to FIG. 22, an example groove (G) of the light shield pattern (LS) is shown. The groove (G) includes an area in which a portion of a rim of the light shield pattern (LS) is concave. A shape of the groove (G) may include at least one of a straight line and a curved line. For example, the groove (G) may have a notch shape.

Referring back to FIG. 22, when a distance D3 between an electro-luminescence device (ELD) and a light shield pattern LS, of a display panel 11h, is shortened, an area of the light shield pattern (LS) according to a minimum available angle of incidence of the light shield pattern (LS) may be reduced. In this case, the opening pattern may overlap with a rim of the light shield pattern. Therefore, the light shield pattern (LS) may include a groove (G) that is an opening pattern overlapped with the rim of the light shield pattern (LS). That is, the light shield pattern (LS) may include the opening pattern (LS) or the groove (G) in consideration of a direction of the total reflection and the area of the light shield pattern (LS).

If the distance (D3) between the electro-luminescence device (ELD) and the light shield pattern (LS) is shortened to overlap the opening pattern with the rim of the light shield pattern, some light that is totally reflected may be shielded. In this case, there is an effect that fingerprint recognition performance may be improved using a groove (G) pattern.

In more detail, according to various aspects of the present disclosure, the light shield patterns corresponding to at least a portion of the electro-luminescence devices may include an opening pattern, and the other light shield patterns corresponding to the other electro-luminescence devices may include the groove.

That is, the display apparatus may include a substrate 101 above which a thin-film transistor array 110 is disposed, a plurality of electro-luminescence devices (ELD) that are disposed above the thin-film transistor array 110, a plurality of light-receiving elements (PD) that are disposed above the thin-film transistor array 110 and are spaced apart from the plurality of electro-luminescence devices (ELD), a plurality of light shield patterns LSs that shield a portion of the plurality of electro-luminescence devices (ELD) and the plurality of light-receiving devices (PD), and a plurality of grooves (G) that are formed on the plurality of light shield patterns LSs and have a predetermined opening direction.

Figure 23:
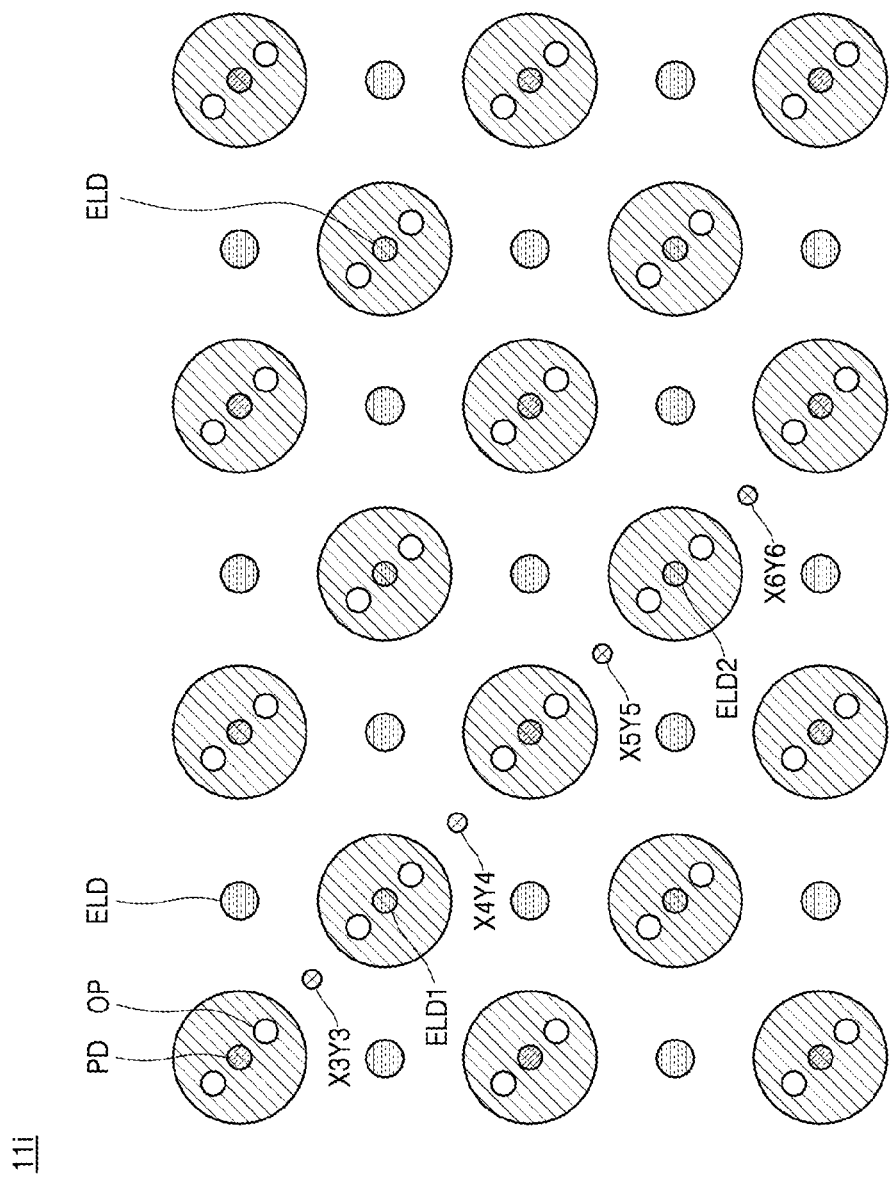
FIG. 23 is a schematic view of an arrangement of a plurality of electro-luminescence devices, a plurality of light-receiving devices, a plurality of light shield patterns and opening patterns according to a twelfth aspect of the present disclosure.

FIG. 23 is a schematic view of an arrangement of a plurality of electro-luminescence devices, a plurality of light-receiving devices, a plurality of light shield patterns and opening patterns according to a twelfth aspect of the present disclosure. A sectional structure of the display panel 11$i$ according to the twelfth aspect of the present disclosure is substantially similar to the sectional structure of the display panel 11$g$ according to the ninth aspect of the present disclosure and the sectional structure of the display panel 11$g$ according to the eleventh aspect of the present disclosure. Therefore, repetitive description thereof is omitted for convenience of explanation. The display panel 11$i$ according to the twelfth aspect of the present disclosure is substantially similar to the display panel 11$g$ according to the ninth aspect. However, in the display panel 11$i$ according to the twelfth aspect of the present disclosure, an electro-luminescence device (ELD) corresponds to a plurality of light-receiving devices (PD). That is, at least one of the plurality of light shield patterns LSs may include a plurality of opening patterns (OP), but is not limited thereto, and the light shield pattern (LS) may include at least one opening pattern and/or at least one groove G.

Referring back to FIG. 23, the light shield pattern (LS) that is disposed above the electro-luminescence device (ELD) may include two opening patterns (OP) that are diagonally arranged at both sides of the electro-luminescence device ELD. However, the present disclosure is not limited to the diagonal direction thereof but may be arranged in a horizontal direction and a vertical direction thereof. Further, each light shield pattern (LS) that is disposed above two diagonally adjacent light-receiving devices (PD) may include two opening patterns (OP) that are diagonally arranged at both sides of the light-receiving device (PD).

Therefore, when the first electro-luminescence device ELD1 emits the light, the light shield pattern (LS) may simultaneously emit light in both directions through the two opening patterns (OP). That is, at least one light shield pattern may emit the light simultaneously in different directions through a plurality of opening patterns.

Two diagonally adjacent light-receiving devices (PD) may sense the fingerprint or touch by sensing an intensity of light output from the first electro-luminescence device ELD1. The light output from the first electro-luminescence device ELD1 is totally reflected from a surface of the display panel 11$i$. For example, the totally reflected light may be totally reflected at a third coordinate (X3Y3) and may be transmitted to an adjacent light-receiving device. The other totally reflected light may be totally reflected at a fourth coordinate (X4Y4) and may be transmitted to the adjacent light-receiving device. That is, an amount of light totally reflected, which was output at the same time in different directions from one another may be sensed at a plurality of coordinates.

According to the above-described configuration, the light shield pattern (LS) that covers the first electro-luminescence device ELD1 may include a plurality of opening patterns (OP), so that the first electro-luminescence device ELD1 may correspond to the plurality of light-receiving devices (PD). Accordingly, as the light output from the electro-luminescence device (ELD) may be sensed at a plurality of coordinates (X3Y3 and X4Y4), the resolution of sensing may be increased in the sensing of the fingerprint or the touch.

In more detail, when the light is emitted from the second electro-luminescence device ELD2, the corresponding light shield pattern (LS) may simultaneously emit the light in both directions at the same time through the two opening patterns (OP). The two diagonally adjacent light-receiving devices (PD) may sense the fingerprint or the touch by sensing the intensity of light output from the corresponding second electro-luminescence device ELD2. The light output from the second electro-luminescence device (ELD2) is totally reflected from the surface of the display panel 11$i$. For example, the totally reflected light may be totally reflected at a fifth coordinate (X5Y5) and may be transmitted to an adjacent light-receiving device. The other light may be totally reflected at a sixth coordinate (X6Y6) and may be transmitted to the adjacent light-receiving device.

However, when the total reflection occurs at the same time at the fourth coordinate (X4Y4) and the fifth coordinate (X5Y5), that is, when the first electro-luminescence device ELD1 and the second electro-luminescence device (ELD2) emit the light at the same time, the amount of light incident on the light-receiving device (PD) provided between the first electro-luminescence device ELD1 and the second electro-luminescence device (ELD2) may be increased. In this case, a threshold value of the light-receiving sensor (PD) may be appropriately adjusted depending on an increase in an amount of light.

Alternatively, emission timing of the first electro-luminescence device ELD1 and the second electro-luminescence device (ELD2) may be controlled such that the first electro-luminescence device ELD1 and the second electro-luminescence device (ELD2) may not emit the light at the same time.

Accordingly, the resolution of sensing may be increased using a relatively small number of electro-luminescence devices (ELD) and light-receiving devices (PD) compared to other aspects.

Hereinafter, aspects of the present disclosure will be described below.

According to aspects of the present disclosure, a display apparatus may include a substrate 101 on which a thin-film transistor array 110 is disposed, a plurality of electro-luminescence devices (ELD) that are disposed above the thin-film transistor array, a plurality of light-receiving devices (PD) that are disposed above the thin-film transistor array 110 and are spaced apart from the plurality of electro-luminescence devices (ELD), a plurality of light shield patterns LSs that shield a portion of the plurality of electro-luminescence devices (ELD) and the plurality of light-receiving devices (PD), and a plurality of opening patterns (OP) that are formed on the plurality of light shield patterns LSs and have a predetermined opening direction.

The opening pattern (OP) of the light shield pattern (LS) of one electro-luminescence device (ELD) of the plurality of electro-luminescence devices (ELD) and the opening pattern (OP) of the light shield pattern (LS) of one light-receiving device (PD) of the plurality of light-receiving devices (PD) may correspond to each other in the predetermined opening direction.

At least a portion of the plurality of light shield patterns LSs may include a plurality of opening patterns (OP).

The plurality of electro-luminescence devices (ELD) may further include a first electrode, a bank that covers an edge of the first electrode, an electro-luminescence layer that is disposed above the first electrode, and a second electrode that covers the electro-luminescence layer.

The bank may be made of a light-absorbing insulating material. A plurality of opening patterns may overlap with the bank.

The display panel may further include a transparent cover that is disposed above the plurality of electro-luminescence devices and the plurality of light-receiving devices.

An electro-luminescence device (ELD) and a light-receiving device (PD) corresponding to each other in the predetermined opening direction may be spaced apart from each other by a predetermined distance.

The area of each of the plurality of electro-luminescence devices (ELD) may be equal to or different from that of the adjacent electro-luminescence device.

The electro-luminescence device (ELD) is shielded by the light shield pattern (LS) and minimum available incidence angle of the plurality of light shield patterns LS s may extend from the critical angle.

At least one electro-luminescence device (ELD) and/or at least one light-receiving device (PD) may be further provided between the electro-luminescence device and the light-receiving device corresponding to each other among the plurality of electro-luminescence devices (ELD) and the plurality of light-receiving devices (PD).

The display panel may be a flexible display panel and the transparent cover may be determined in consideration of the property of the flexible display panel.

At least one electro-luminescence device (ELD) of the plurality of electro-luminescence devices may correspond to a plurality of light-receiving devices (PD).

At least one of the plurality of light shield patterns LSs may include a plurality of opening patterns.

At least one of the plurality of light shield patterns LSs may include a plurality of grooves.

At least one light shield pattern (LS) may output the light at the same time in different directions through a plurality of opening patterns (OP).

At this time, a portion, of the plurality of light-receiving devices, corresponding to the plurality of opening patterns (OP) and grooves (G) arranged in any light shield pattern (LS) may sense the amount of light totally reflected, which was output at the same time in different directions, at the plurality of coordinates, through the plurality of opening patterns (OP) and grooves (G) arranged in the light shield pattern (LS).

According to aspects of the present disclosure, the display apparatus may include the substrate 101 above which the thin-film transistor array 110 is disposed, the plurality of electro-luminescence devices (ELD) that are disposed above the thin-film transistor array 110, the plurality of light-receiving devices (PD) that are disposed above the thin-film transistor array 110 and are spaced apart from the plurality of electro-luminescence devices, the plurality of light shield patterns LSs that shield a portion of the plurality of electro-luminescence devices (ELD) and the plurality of light-receiving devices (PD), and the plurality of grooves (G) that are formed above the plurality of light shield patterns LSs and have the predetermined opening direction. The display apparatus may selectively include the groove (G) or the opening pattern.

The plurality of grooves (G) may include the area in which a portion of the rims of the plurality of light shield patterns are concave.

The shape of the plurality of grooves (G) may include at least one shape of the straight line and a curved line.

The present disclosure is not limited to the above-described aspects and attached drawings. It will be apparent to one having ordinary skill in the art to which the present disclosure pertains that various replacements, modifications and changes may be made without departing from the technical spirit of the disclosure.

What is claimed is:

1. A display apparatus, comprising:
a thin-film transistor array disposed on a substrate;
a plurality of electro-luminescence devices comprising a first electrode disposed on the thin-film transistor array, an electro-luminescence layer disposed on the first electrode, a second electrode disposed on the electro-luminescence layer, and a bank covering an edge of the first electrode;
a plurality of light-receiving devices disposed on the thin-film transistor array and spaced apart from the plurality of electro-luminescence devices;
a plurality of light shield patterns shielding the plurality of light-receiving devices;
at least one opening pattern arranged in each light shield pattern; and
a transparent cover disposed over the plurality of light shield patterns,
wherein at least a portion of light which is reflected by the transparent cover and then passes through the at least one opening pattern of each light shield pattern, is input to each light-receiving device corresponding to each light shield pattern.

2. The display apparatus of claim 1, wherein each light shield pattern has a width greater than that of each light-receiving device,
wherein each light shield pattern comprises a protruding area corresponding to an edge of each light shield pattern and laterally protruding with respect to each light-receiving device, and
wherein the at least one opening pattern of each light shield pattern is disposed in the protruding area of each light shield pattern.

3. The display apparatus of claim 2, wherein the at least one opening pattern has a minimum incidence angle that is greater than a predetermined critical angle, wherein the minimum incidence angle is between lines connecting an edge of each opening pattern to an edge of each light-receiving device and a normal line of an upper surface of the transparent cover, and the predetermined critical angle is determined by at least one of the transparent cover and a medium contacting the transparent cover.

4. The display apparatus of claim 2, wherein the at least one opening pattern vertically overlaps at least a portion of each light-receiving device.

5. The display apparatus of claim 1, wherein the plurality of electro-luminescence devices includes a plurality of electro-luminescence devices for display and a plurality of electro-luminescence devices for sensing,
wherein the plurality of light shield patterns further shields the plurality of electro-luminescence devices for sensing, wherein light which is outputted from any one electro-luminescence device for sensing among the plurality of electro-luminescence devices for sensing and passes through the at least one opening pattern included in any one light shield pattern corresponding to the any one electro-luminescence device for sensing is totally reflected at a predetermined point of the transparent cover, and wherein the light which is totally reflected at the predetermined point is inputted to any one light-receiving device among the plurality of light-receiving devices through the at least one opening pattern included in any other one light shield pattern corresponding to the any one light-receiving device.

6. The display apparatus of claim 5, wherein the predetermined point corresponds to the any one electro-luminescence device and the any one light-receiving device which are spaced apart from each other by a predetermined distance.

7. The display apparatus of claim 5, wherein the display panel is a flexible display panel and a material for the transparent cover is determined in accordance with a property of the flexible display panel.

8. The display apparatus of claim 5, wherein each of the plurality of electro-luminescence devices for sensing is shielded by the light shield pattern, and a minimum incidence angle of the light shield pattern is greater than a predetermined critical angle, and wherein the minimum incidence angle is a minimum angle between lines connecting an edge of each opening pattern to an edge of each light-receiving device and a normal line of an upper surface of the transparent cover.

9. The display apparatus of claim 5, wherein at least one of the plurality of electro-luminescence devices and/or at least one of the plurality of light-receiving devices are disposed between the any one electro-luminescence device for sensing and the any one light-receiving device.

10. The display apparatus of claim 5, wherein at least one of the plurality of light shield patterns includes a plurality of opening patterns.

11. The display apparatus of claim 10, wherein the plurality of opening patterns is configured to output light from the electro-luminescence device which is shielded by one of light shield patterns in different directions.

12. The display apparatus of claim 11,
wherein light which are outputted in a plurality of different directions through the plurality of opening patterns which are included in the one of light shield patterns, are totally reflected at a plurality of points of the transparent cover respectively, and
wherein the light which are totally reflected at the plurality of points respectively, are a plurality of different light-receiving devices corresponding to the plurality of points.

13. The display apparatus of claim 1, wherein the plurality of light-receiving devices are alternate with the plurality of electro-luminescence devices in a predetermined direction.

14. The display apparatus of claim 1, wherein the bank has a light-receiving hole corresponding to at least a portion of each of the light-receiving devices.

15. The display apparatus of claim 14, further comprising at least one light reception improving pattern disposed at a portion of each of the light-receiving devices that corresponds to the light-receiving hole.

16. The display apparatus of claim 15, wherein the at least one light reception improving pattern is made of the same material as the bank.

17. The display apparatus of claim 1, wherein the bank is made of a light-absorbing insulating material.

18. The display apparatus of claim 1, wherein the bank is made of a light-transmitting insulating material.

19. The display apparatus of claim 1, further comprising at least one supplementary electro-luminescence device disposed over the thin-film transistor array and spaced apart from the plurality of electro-luminescence devices and the plurality of light-receiving devices, wherein each of the supplementary electro-luminescence devices comprises:
a supplementary first electrode disposed on the thin-film transistor array;
a supplementary electro-luminescence layer disposed on the supplementary first electrode; and
a supplementary second electrode disposed on the supplementary electro-luminescence layer,
wherein the bank covers an edge of the supplementary first electrode.

20. The display apparatus of claim 1, wherein each of the light-receiving devices comprises:
a first electrode disposed above the thin-film transistor array;
a PIN junction layer disposed above the first electrode; and
a second electrode disposed above the PIN junction layer.

21. The display apparatus of claim 1, further comprising a transparent encapsulating unit covering the plurality of electro-luminescence devices and the plurality of light-receiving devices,
wherein the plurality of light shield patterns is disposed on the transparent encapsulating unit.

22. The display apparatus of claim 1, wherein each light-receiving device absorbs at least a portion of light generated in an effective light-receiving area corresponding to each of the at least one opening pattern in an upper surface of the transparent cover.

23. A display apparatus, comprising:
a thin-film transistor array is disposed on a substrate;
a plurality of electro-luminescence devices disposed on the thin-film transistor array and including a plurality of electro-luminescence devices for display and a plurality of electro-luminescence devices for sensing;
a plurality of light-receiving devices disposed on the thin-film transistor array and spaced apart from the plurality of electro-luminescence devices;
a plurality of light shield patterns configured to shield the plurality of electro-luminescence devices for sensing and the plurality of light-receiving devices; and
a transparent cover disposed over the plurality of light shield patterns,
wherein each of the plurality of light shield patterns includes a groove, and
wherein at least a portion of light is reflected by the transparent cover and then passes through the groove of each light shield pattern and is input to each corresponding light-receiving device.

24. The display apparatus of claim 23, wherein the groove of each light shield pattern includes an area in which a portion of a rim of each light shield pattern is concave.

25. The display apparatus of claim 24, wherein the groove has a straight line shape or a curved line shape.

26. The display apparatus of claim 23,
- wherein light which is outputted from any one electro-luminescence device for sensing among the plurality of electro-luminescence devices for sensing passes through the groove and is totally reflected at a predetermined point of the transparent cover, and
- wherein the light which is totally reflected at the predetermined point is inputted to any one light-receiving device among the plurality of light-receiving devices through the groove included in any other one light shield pattern corresponding to the any one light-receiving device.

27. The display apparatus of claim 23,
- wherein light which is outputted in a plurality of different directions through each groove included in each of the plurality of light shield patterns, is totally reflected at a plurality of points of the transparent cover respectively, and
- a plurality of different light-receiving devices correspond to the plurality of points.

* * * * *